United States Patent [19]
Reeb

[11] Patent Number: 5,285,191
[45] Date of Patent: Feb. 8, 1994

[54] LC MARKER CONSTRUCTION USEFUL AS AN ELECTROMAGNETICALLY INTERROGATABLE TRANSPONDER MEANS

[76] Inventor: Max E. Reeb, Mozartstr. 29, D-7320 Göppingen, Fed. Rep. of Germany

[21] Appl. No.: 883,249

[22] Filed: May 7, 1992

Related U.S. Application Data

[60] Continuation of Ser. No. 650,935, Feb. 5, 1991, abandoned, which is a continuation of Ser. No. 135,547, Dec. 18, 1987, Pat. No. 4,990,891, which is a continuation of Ser. No. 28,893, Mar. 23, 1987, abandoned, which is a division of Ser. No. 513,970, Jun. 29, 1983, Pat. No. 4,694,283.

[30] Foreign Application Priority Data

Oct. 30, 1981 [DE] Fed. Rep. of Germany ....... 3143208

[51] Int. Cl.$^5$ .............................................. G08B 13/18
[52] U.S. Cl. ..................................... 340/572; 29/846; 333/219; 428/901
[58] Field of Search ...................... 340/572; 333/219; 428/901; 29/846, DIG. 3, DIG. 16, DIG. 40

[56] References Cited

U.S. PATENT DOCUMENTS 4,694,283  9/1987  Reeb .................... 340/572
4,990,891  2/1991  Reeb .................... 29/846

Primary Examiner—Glen R. Swann, III

[57] ABSTRACT

A planar LC marker construction useful as an electromagnetically interrogatable transponder is comprised of at least two conductive paths forming planar clockwise and counterclockwise turning spiral patterns (if viewed from the same side) aligned face-to-face, and turn by turn, in opposition to each other, and spaced by an insulative layer. The layer may have various components, at least one of which may be an adhesive layer to co-perform a capacitive function at radio frequency. At least in part that layer may configure as a sheet. The construction features a superior in-system detectivity owing to a very low RF electromagnetic field deflection, and can be produced cheaply for one-time use.

99 Claims, 12 Drawing Sheets

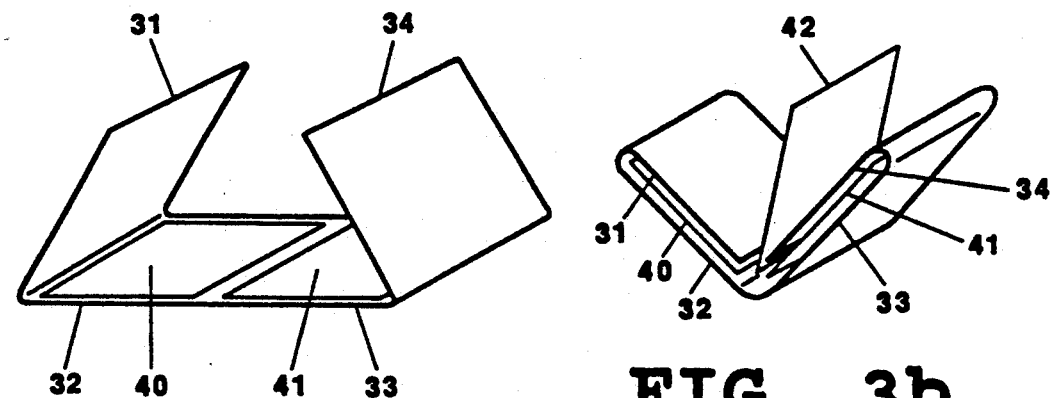
FIG. 3a  FIG. 3b
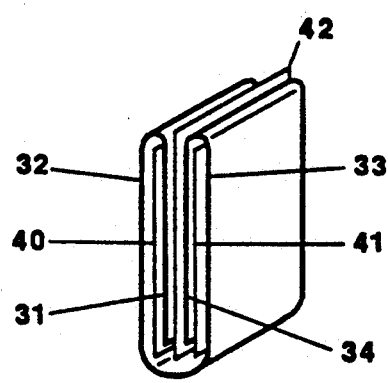
FIG. 3c
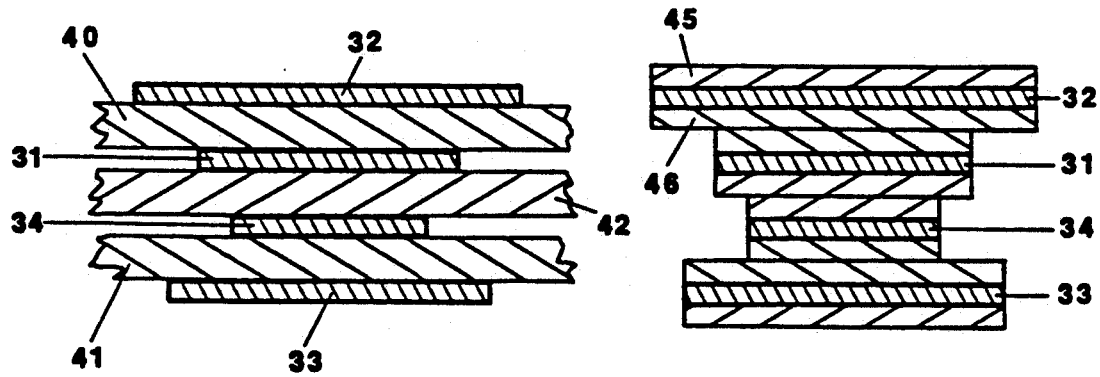
FIG. 4  FIG. 5

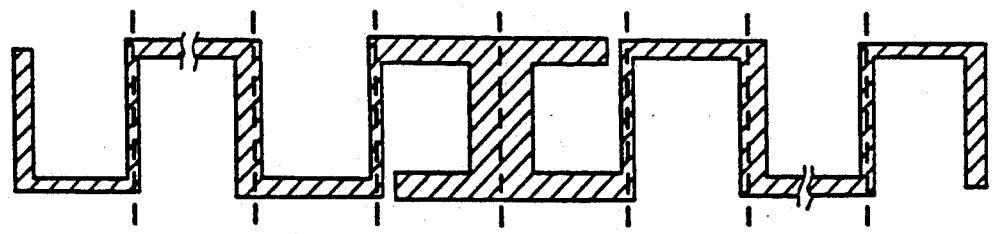
FIG. 14
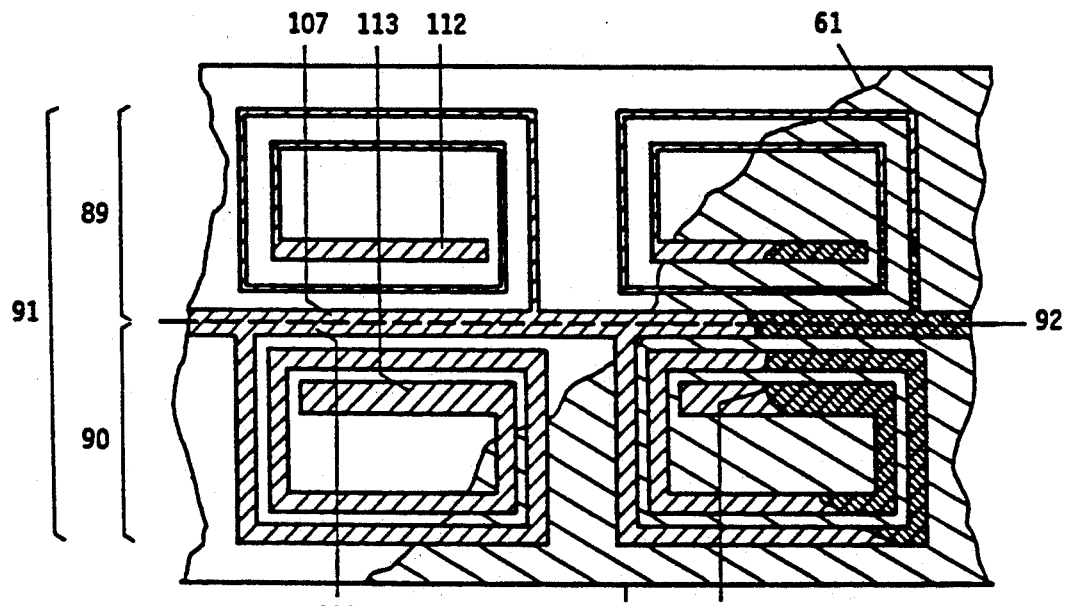
FIG. 15
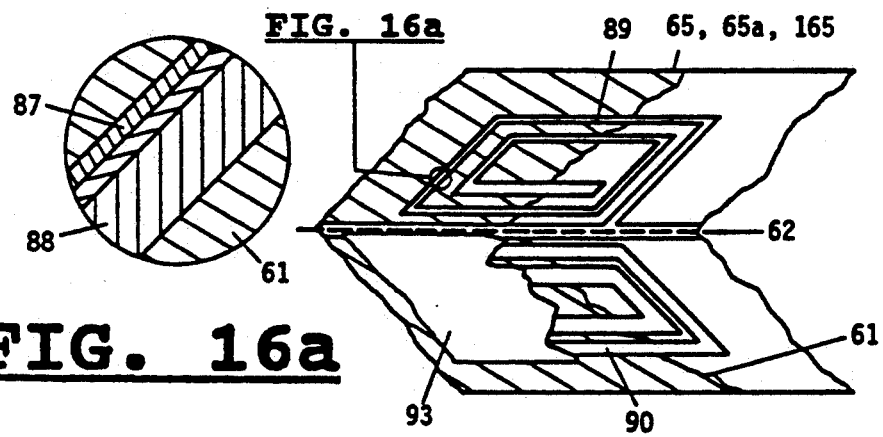
FIG. 16a
FIG. 16

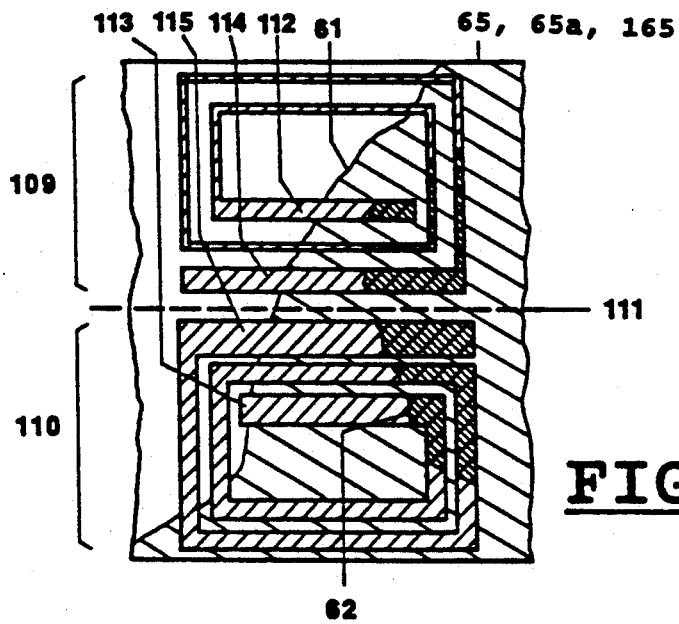
FIG. 17
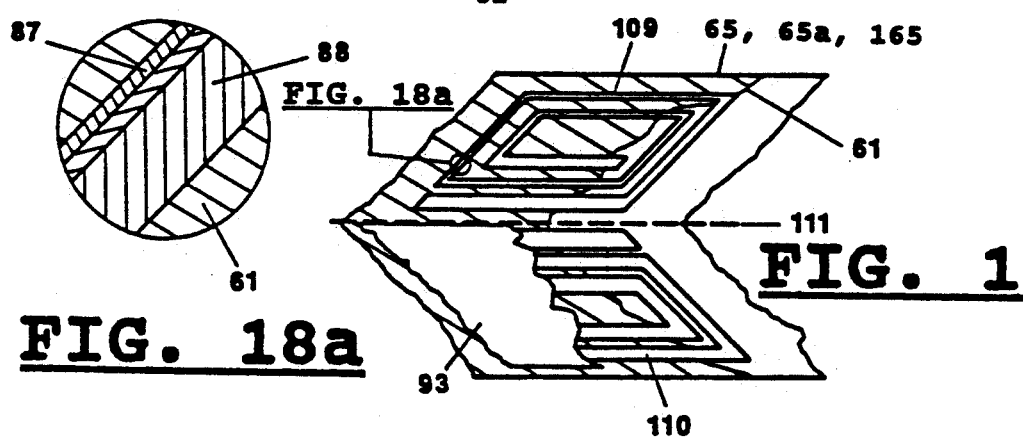
FIG. 18a
FIG. 18
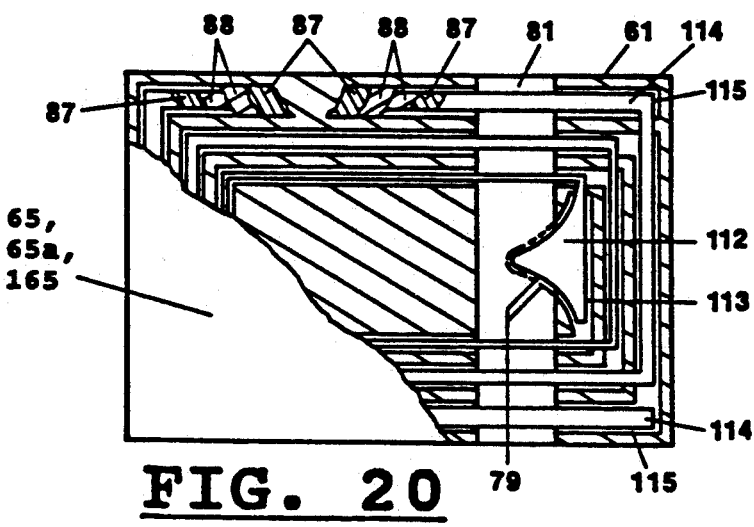
FIG. 20

LC MARKER CONSTRUCTION USEFUL AS AN ELECTROMAGNETICALLY INTERROGATABLE TRANSPONDER MEANS

CROSS-REFERENCE TO RELATED APPLICATIONS

This application is a continuation of application Ser. No. 07/650,935 filed on Feb. 5, 1991 (abandoned), which is a continuation of application Ser. No. 07/135,547, filed on Dec. 18, 1987, now U.S. Pat. No. 4,990,891, which is a continuation of application Ser. No. 07/28,893, filed on Mar. 23, 1987 (abandoned), which is a division of application Ser. No. 06/513,970 filed on Jun. 29, 1983, now U.S. Pat. No. 4,694,283.

BACKGROUND OF INVENTION AND FIELD OF INVENTION

The invention concerns an LC marker construction useful as an RF interrogatable transponder means in electronic security systems for alarming the presence of said LC marker construction in an radio frequency electromagnetic field within a security zone.

THE PRIOR ART

LC constructions of the aforementioned type are known from U.S. Pat. No. 3,913,219, issued Oct. 21, 1975 ("Planar Circuit Fabrication Process", Inventor LICHTBLAU). Said Patent describes a planar circuit comprising a flexible dielectric sheet having an inductively reacting conductive spiral path bonded to one side thereof. Said spiral path terminates, at either ends, into first and second conductive areas which are mutually aligned and spaced by said dielectric sheet, thus forming a lumped capacitor. Said capacitor and said conductive spiral cooperate to form an LC resonant circuit. Similar LC constructions are described in U.S. Pat. Nos. 3,863,244, 3,967,161, and 4,021,705. All of these LC constructions exhibit four essential characteristics. (1) The inductor configures as a single conductive spiral. (2) First conductive material is arranged to react inductively only. (3) Second conductive material is arranged to react capacitatively only. (4) An electrical through-contact must be provided through said flexible dielectric sheet. Attempts to make these LC constructions small in size detrimentally affect their detectability within security systems, from the following reasons. Wasting on the LC circuit's area first metal for reacting inductively only and second metal for reacting capacitively only leads to a highly progressive metal coverage of the LC circuit's real estate, the more circuit size is reduced, provided said dielectric sheet cannot undergo a certain thickness. The thus high metal coverage of the LC circuit's real estate disperforms manifoldly: Firstly, all portions of the conductive spiral path themselves form infinitesimal short circuit loops, resulting in an inherent decrease of inductor's inductance considerably below the maximum inductance attainable with inductor paths configured like the spring of a watch. Consequently, such planar spiral inductor's inductance and Q are detrimentally reduced versus reduction of planar spiral size. Secondly, exactly that metal provided to desirably form a capacitor only, and that are the capacitor plates, in the manner of a much wider short circuit loop, effects a deleterious reduction of inductance, too. Hence, larger capacitor plates are required for a resonance at a predetermined frequency, which larger metal plates even more reduce the available circuit inductance, and progressively so on. Hence, it is understood, that the efficiency of the metal input for attaining a desired resonance and detectability performance output is getting worse versus a decrease of LC structure's size, in a progressive manner. Thirdly, the more metal is arranged on the real estate of such an LC marker construction, the more eddy current counter induction takes place, resulting in a distortion of an interrogating RF magnetic field so as to have it bypass the LC marker construction, rather than guiding an utmost number of field lines through the interior thereof to thereby maximize the effect on an interrogating security system.

U.S. Pat. No. 4,369,557, issued Jan. 25, 1983 ("Process for Fabricating Resonant Tag Circuit Constructions", Inventor VANDEBULT) describes an LC marker construction which also comprises an inductor and a lumped capacitor. The inductor is formed of two conductive spiral paths, one spiral path juxtaposed to and in electrical communication with the other. The non-juxtaposing ends of said spiral paths terminate in first and second capacitor plates. First and second capacitor plates superpose each other in alignment, spaced by the double thickness of a dielectric sheet, the latter thereby also insulating one from another first and second turns of said conductive spiral paths to thus form a continuous dual layer coil of uniform turn direction. Respective inductor portions, i.e. respective turns of first and second spiral paths, are substantially misaligned with respect to one another, whereby capacitive coupling between said first and second inductor portions through the double layered dielectric sheet is minimized. The capacitor plates and the double layer of said dielectric sheet are laminated together to thereby form a defined lumped resonance capacitance. A minimized capacitance between inductor turns is attained by that the inductor turn region is not laminated. This is, since turn-to-turn leakage capacitances to result are subject to deviations in response to the degree of mutual misalignment of inductor turns. Thus, the higher the lumped capacitance between lumped capacitor plates is made, the closer tolerances of a resonant frequency can be attained, and vice versa. Hence, in view of the above-mentioned distortion effect on a scanning RF electromagnetic field this construction comes even shorter since a practical dielectric sheet cannot undergo the thickness as known from the Lichtblau construction, however, becomes effective with its double thickness between capacitor plates, which leads to an even higher progressive metallization of a small LC marker's real estate and thus to considerable limitations and restrictions of such LC structure in its practical use.

It is understood that when such constructions are required in large quantities, the production costs are of essential significance.

SUMMARY OF THE INVENTION

A first object of the invention is to provide an LC marker construction which is very reliable in use. A second object of the invention is to provide an LC structure that exhibits close tolerances of a resonant frequency, and lends itself to low cost make. A third object of the invention is to provide an LC structure having an inherently high long-term reliability.

The first object is achieved by an LC construction comprised of two planar spiral patterns formed of conductor strips and having multiple turns arranged mutually aligned turn by turn and turn portion by turn portion, so as to cover each other, in a counter turning relationship when viewed from the same side, and spaced from one another by at least one insulative layer, thereby forming a plurality of concentric LC stripline loops. Between any two mutually superposed conductor strips to form a stripline section a certain capacitance exists. The total of all these capacitances and the inductance of the conductor strips suffice for a resonance capability of the LC construction without particular capacitor plates, by that the effective capacitance distributes along all insulatively spaced conductor strips. This scheme of utilizing as an useful and very precisely transforming circuit capacitance what works as an undesired leakage capacitance in constructions according to U.S. Pat. No. 4,369,557 overcomes the need for lumped capacitor plates and thus minimizes the metallization of the real estate of a respective LC construction, thereby minimizing the performance dropping distortion effect on an energizing RF electromagnetical field as a result of eddy current counter induction.

The spiral patterns may conductively connect to each other, or not. A dielectric path, or a continuous dielectric sheet, or various layers may space said spiral paths. Among is at least one thin adhesive layer effective both as a configuration stabilizing connecting means between conductor path faces and/or faces of at least one dielectric layer inserted therebetween and as part of the capacitive working element of LC stripline portions, so that such adhesive layer, by virtue of its dielectric permittivity and thickness, codetermines the resonant characteristics of the LC marker construction.

Both the inherently low electromagnetic field distortion and—owing to the fully fixed configuration of the aligned spiral patterns—the stable resonant characteristics make the new LC construction very reliable in practical use within RF electromagnetic interrogation systems.

The second object is achieved by that the conductor strips have different configurations and/or dimensions in the superposed areas, particularly different widths. Thereby but small capacitance deviations result from mutual alignment errors within limits for close tolerances of the resonant frequency. Further, a minimization of leakage capacitances and thus optimized RF characteristics may be attained by that a dielectric is provided only in the projected spaces between one another superposing portions of said conductive spiral patterns, rather than across lateral turn-to-turn areas.

The third object is achieved by that the superposed conductive spiral patterns are either electrically insulated from one another, and hence do not take any electrical contact to be made, or may be conductively connected with one another without any need to provide such conductive connection through a flexible insulative sheet. As a consequence, any product weakness owing to long-term unreliable electrical contacts through elastic dielectric layers is completely overcome.

In order to minimize the manufacturing costs of an LC marker construction according to the invention the spiral patterns may be cut or punched or etched out of a metal foil. The patterns may as well be vapor-deposited, sprayed or applied in other conventional ways, e.g. by electrodeposition or the like, on an electrically nonconductive carrier sheet. The dielectric may be applied directly on respective conductor path pattern portions in the form of a coating, or a dielectric film, or a sheet. For lowest production costs said at least one adhesive layer for fixing together superposed parts and supporting the capacitive function of a dielectric layer spacing conductive paths may be very thin and present only in projected spaces between conductive paths.

Since the conductor strips may be made extremely thin, a sufficiently high inductance and capacitance value can be achieved and a device to incorporate the LC marker construction also can be made very thin. Hence, such device can be made highly flexible and, in particular, can be processed like a conventional paper, plastic or cardboard tag.

In order to protect the finished LC marker construction it may be sealed on a flexible and electrically insulative cover sheet or may be embedded into a flexible electrically insulating composition and thus given a more rigid shape to appear e.g. as a conventional tag- or card-like device. Though the LC marker construction consists of various layers, a respective device to incorporate it may be thin and flexible so that, if a plurality of individual LC marker constructions is covered with a continuous carrier sheet to thus form an endless plurality of individual devices, a plurality of LC marker constructions can thus be rolled up into a supply roll.

LC marker constructions according to this invention, despite assembling from a minimum count of inexpensive materials and despite low manufacturing costs exhibit close tolerances of their radio frequency characteristics at a satisfactory Q-factor. Particularly when made small in size they offer an unprecedented in-system detectivity as a result of an unprecedented low distortion effect on a scanning RF electromagnetic field they are subjected to for detection.

BRIEF DESCRIPTION OF THE DRAWINGS

Further advantages and features of the invention will become apparent from the following description of several examples of the invention with reference to the attached drawing, from the subclaims, and from the drawing. In the drawing

FIGS. 3a, 3b, 3c show several schematic views for explanation of the folding of the conductor strip structure, illustrated in FIG. 1;

FIGS. 4 and 5 are partial sections through the folded structure shown in FIG. 3;

FIG. 14 is a plan view on a conductor strip structure for the manufacture of an identification device with eight or more superposed fold planes;

FIGS. 15, 16, and 16a are schematic views for explanation of the manufacture of an identification device with only two fold planes;

FIGS. 17, 18 and 18a are schematic views for explanation of an embodiment in which only capacitive coupling exists between two superposed planes;

FIG. 20 is a schematic view for explanation of the adjustment of the capacitive member in the embodiment of FIGS. 17 and 18 by means of a dielectric adjustment tape.

The chief element of the identification device of the invention is an electric unit constituting a parallel resonant circuit and is formed of an inductive member and distributed capacities. Hereafter this electrical unit will first be described.

Since the described identification device can be manufactured especially rapidly and simply with a minimum of waste of raw material, it is especially useful for provision in merchandise price tags and safeguarding tags.

Figure 1:
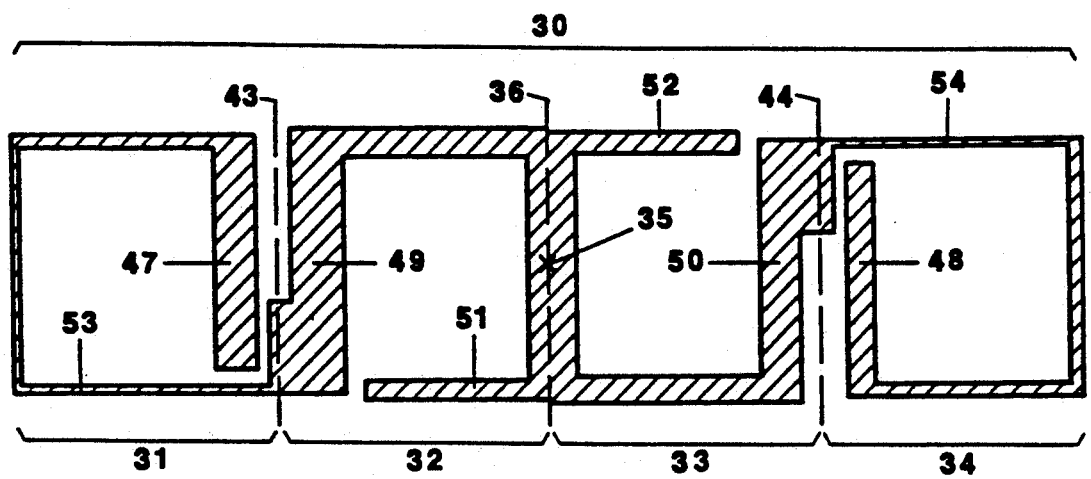
FIG. 1 shows a schematic view of a conductor strip structure developed into a plane which; when suitably folded together, results in an inductive member.
Figure 2:
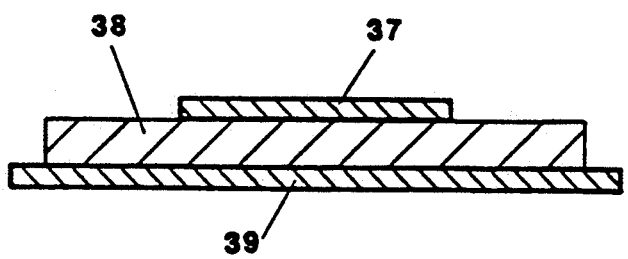
FIG. 2 is a sectional view of a conventional strip line.

From a thin metal foil which may already be inseparably coated on one or both sides with suitable dielectric coatings a planar structure 30 having the structure of a conductor strip as shown in FIG. 1 is produced. It is an essential property of the conductor strip structure consisting of four coherent partial structures 31 to 34 (hereinafter termed "leaves" and illustrated in simple sketches as continuous leaves that, although it appears to be symmetrical with respect to the center point 35, all the conductor strip portions symmetrically opposed with respect to the axis 36 have different widths so that symmetrical pairs differ in width only by one width step. By way of explanation FIG. 2 is a cross section through a strip conductor consisting of a wave guide strip 37, a dielectric of constant thickness 38, and a ground area 39 which is larger than the width of the wave guide strip. When the wave guide strip is laterally shifted this does not affect the capacitor coating thereof.

In case the conductor strip structure shown in FIG. 1 is manufactured from uncoated metal foil, it will be folded as shown in the simplified sketch of FIGS. 3a, 3b, and 3c with interposition of the dielectric layers 40, 41 and 42 along the fold lines 43, 44 and 36 in FIG. 1 so as to result in a cross section through any desired part along the margin of the folded assembly shown in FIG. 4. In case the conductor strip structure shown in FIG. 1 is manufactured from a metal foil previously laminated with suitable dielectric coatings 45 and 46 the insertion of the layers 40, 41 and 42 is unnecessary, and after analogous folding a corresponding cross sectional configuration illustrated in FIG. 5, i.e, altogether a rectangular structure with recessed inside region is obtained.

In both cases a Thomson oscillating circuit is formed having an oscillating capacity composed of the transformation of distributed conductor capacitances and concentrated capacitances of the opposed conductor strip portions 47 and 48, 47 and 49, 48 and 50. In a rough approximation the structure can be described by the equivalent circuit shown in FIG. 6; therein corresponding parts and locations are designated with the same reference numerals as in FIG. 1.

The different width in folded condition of superposed conductor strips has several functions:

(a) Inaccuracies in superposing the individual sheets hardly change the capacitance between conductor strip portions extending one above the other, as long as a positioning tolerance is maintained within geometrically simply determinable and specifiable limits. This effect can be utilized as long as the width of the conductor strips is far greater than the thickness of the dielectric separating layers and the electric field between metal layers thus extends predominantly homogeneously. As a result, the active resonant circuit capacitance is substantially invariable with respect to positioning inaccuracies on folding within registration tolerances and mainly depends on the dimensional accuracy of the conductor strips and on properties of the dielectric.

(b) Since the conductor strips mutually cover each other and the width of the conductor strips is substantially greater than the thickness of the insulating separating layers between the coil windings, the coupling of the spatially distributed windings is very firm and the mutual leakage inductance thereof is very low. This results in very constant transformation conditions for the individual distributed line capacitances.

Figure 6:
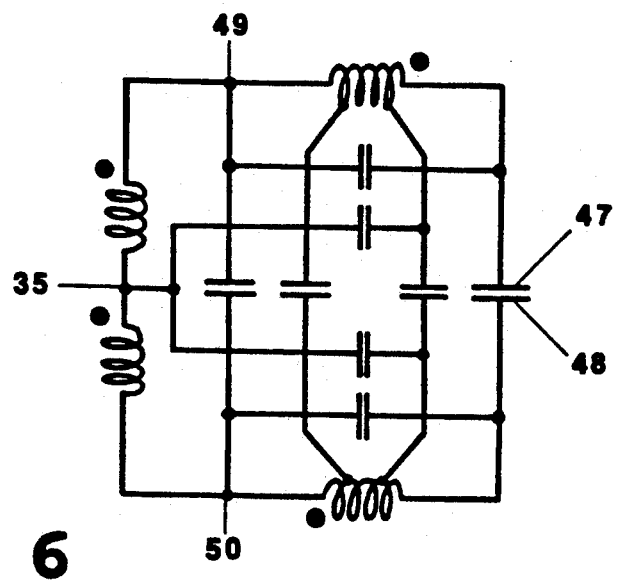
FIG. 6 is an equivalent circuit diagram of the electrical unit shown in FIGS. 3 to 5 forming a parallel resonant circuit.

(c) After having been folded together the leaves 32 and 33 of low impedance, in relation to the center point 35 of the structure in FIG. 1 and the coil center 35 of FIG. 6, are disposed at the outside of the device and enclose the leaves 31 and 34 of high impedance in relation to the same points in the manner of a static shield in the interior of the arrangement with the result that upon capacitive approach the obtained structure only slightly changes its resonant frequency. The branches 51 and 52 are not a component of the coil proper but are low impedance shielding areas which shield the higher impedance line sections 53 and 54 against the outside.

(d) The externally disposed windings of maximum conductor width, i.e. least strip resistance, are the windings where the highest current intensity occurs. Hence, the design of the device also favors the highest possible Q-factor.

Figure 7:
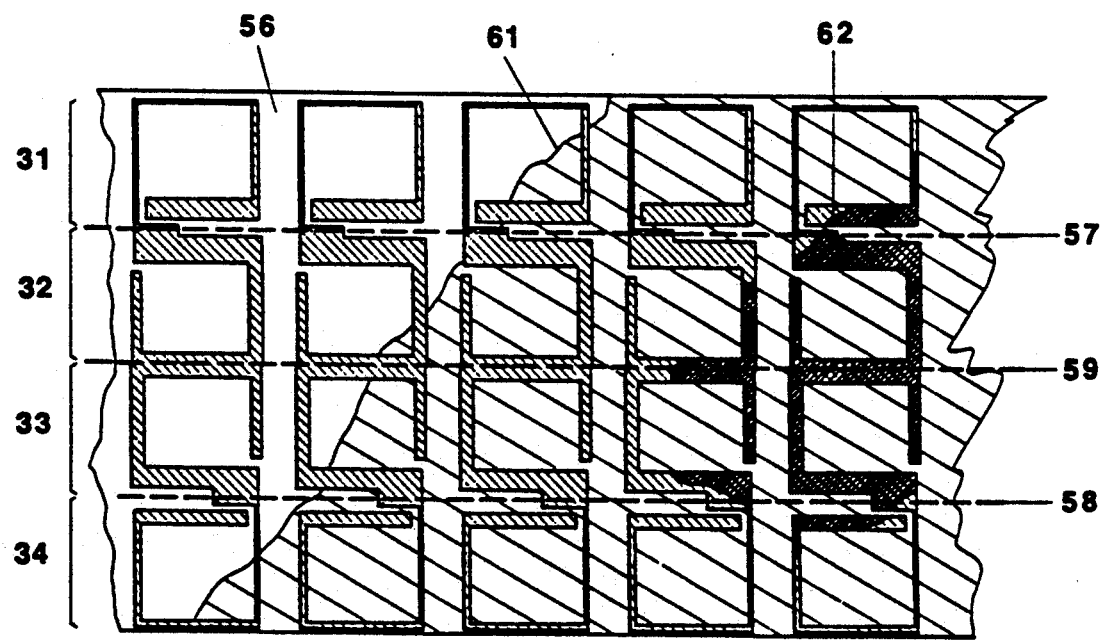
FIG. 7 is a plan view of g carrier sheet carrying a plurality of conductor strip structures for the manufacture of identification devices.

High positioning accuracy of the individual leaves placed one upon the other is ensured by positive folding. This is achieved by fixing in the production process the conductor strip structure onto a continuous carrier sheet 56 as shown in FIG. 1, and in this operation and within the same tool, the fixed structure together with the carrier sheet 56 are continuously perforated without pitch shift relative to the fixed structure along the lines 43, 44 and 36 in FIG. 1 so that perforation lines 57, 58 and 59 are formed along the direction of advance of the sheet 56, as shown in FIG. 7, along which the continuous sheet can be folded together.

The perforation is made such that an electrically conductive connection is retained through the perforated region of the structure;

that the longitudinal stiffness of the substrate material can be utilized to enhance guided folding; and that portions of the carrier sheet no longer needed can be removed once the sheet has been folded along the perforation.

If, for the production of the structure shown in FIG. 1, a metal foil dielectrically coated on both sides is used as starting material, the insertion of the coextensive insulating layers 40, 41 and 42 during folding is unnecessary. Since the active dielectric layers shown in FIG. 5 then have the same contours as the conductor strips, the interiors and exteriors of the finally folded device are then free of any material so that the structure, when folded together, does not yet have a form stable in itself.

Figure 8:
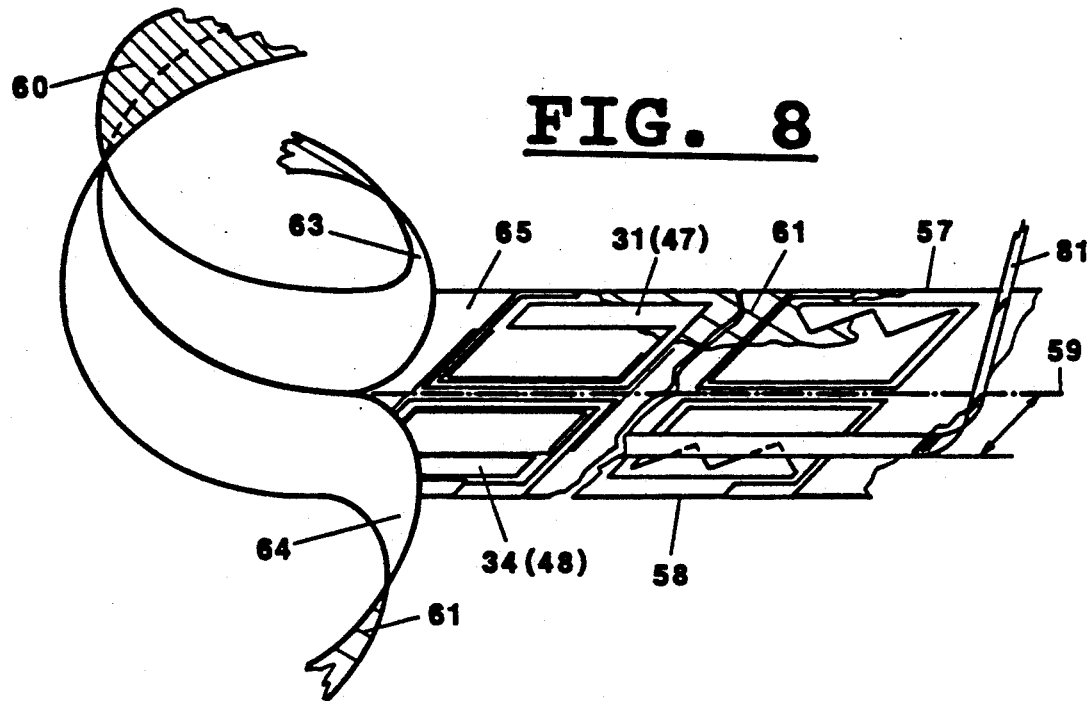
FIGS. 8, 9 and 10 are schematic views for explanation of further embodiments of the invention permitting adjustment of the capacitive member in the course of the manufacturing method.
Figure 9:
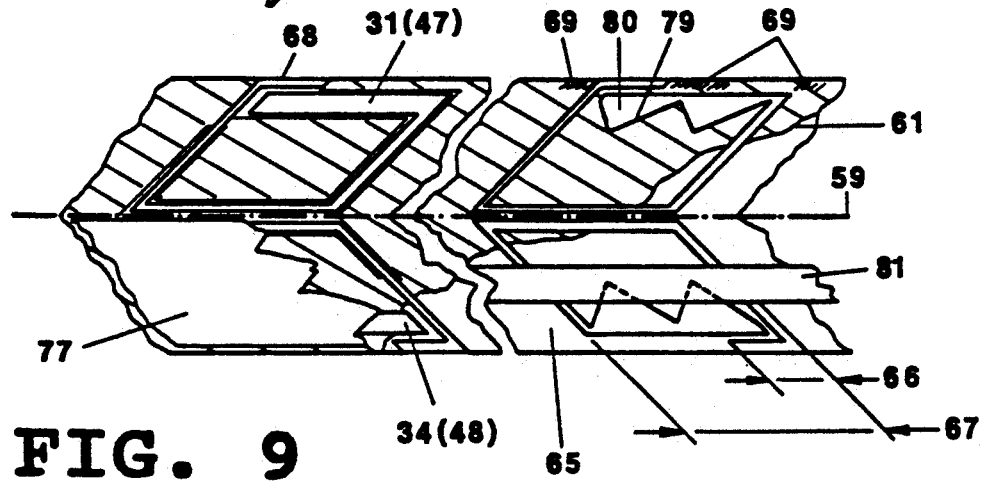

The production and dimensionally stabilizing incorporation of the unit between protective covering faces may be accomplished, in a manner shown in FIGS. 7, 8 and 9, by using as continuous carrier sheet 56 a material suited for this purpose and provided, for example, with areas 60 to be printed, and having on the free side an adhesive or sealing film 61 producing differential adhesion in the zones inside and outside the perforation lines 57 and 58 capable of being selectively activated, e.g. under the influence of pressure and/or heat. After the transfer of the structure consisting of the leaves 31 to 34 to such a carrier sheet the zone-wise differential adhesion has the effect that the leaves 32 and 33 initially adhere more firmly to the sheet 56 than do the leaves 31 and 34.

By means of a suitable method an extremely thin adhesive layer 62 is applied onto the surface of the conductor strip structure, but not onto the sheet, as indicated in FIG. 7, which, after folding along the lines of perforation 57 and 58, produces higher adhesiveness between the leaves 31, 32 and 34, 33 respectively than that initially produced between the sheets 32, 33 and the sheet 56.

After the performance of the first folding operation along the lines of perforation 57 and 58 which adhesively positions the leaves 31, 32 and 34, 33 on each other, this permits the separation and removal of carrier sheet portions 63 and 64 no longer required along the perforation lines 57 and 58, as shown in FIG. 8, without the conductor strip structure being removed from the remainder 65 of the carrier sheet. The second folding operation along the perforation line 59 then positions the leaves 31 and 34 on each other, as illustrated in FIG. 9.

When, after the last folding operation which closes the structure to form a resonant circuit, the adhesive or sealing film 61 inside the portion 65 of the carrier sheet 56 which remained as external sheath is activated in a suitable way, e.g. under the influence of pressure and/or heat, the described structural feature has the additional effect that the folded structure is sheathed not only regarding the recessed interior but is also sealed along the external perforation margins in the areas 69. This ensures high stability of the device against displacement so that the resulting strip can be rolled up into a supply roll.

Figure 11:
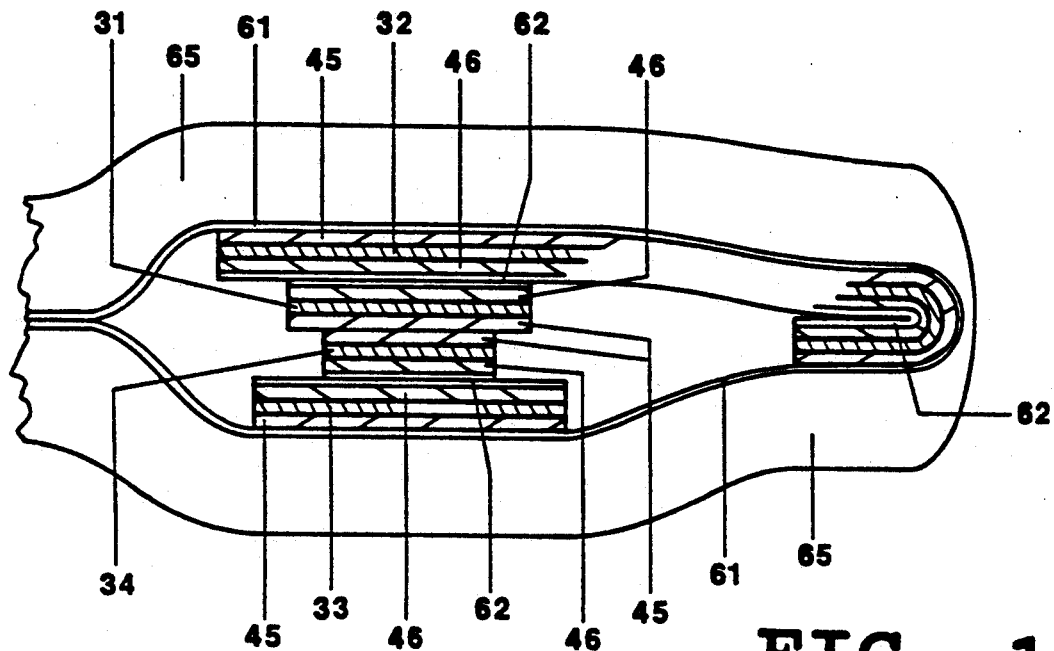
FIG. 11 is a section through a marginal zone of a final identification device sealed into protective film.

By way of illustration FIG. 11 shows a cross section through the external region of a device produced in this way.

Figure 12:
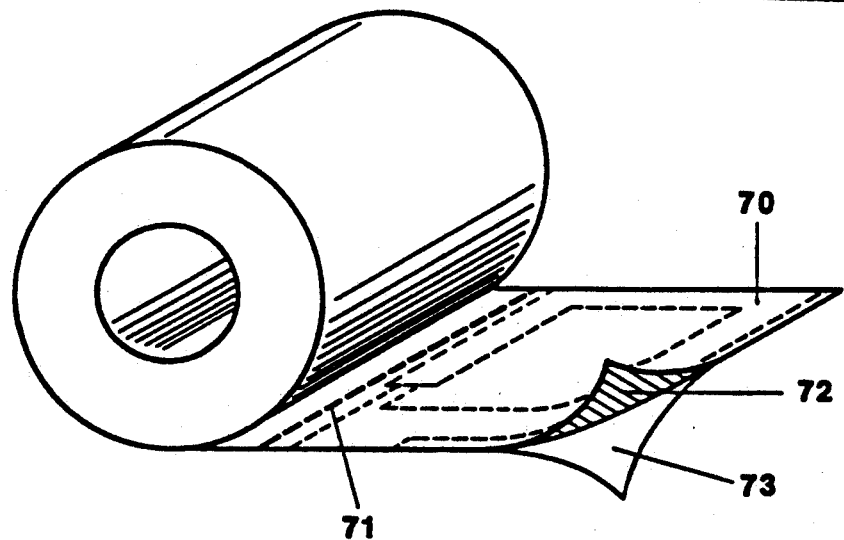
FIG. 12 is a schematic view of a carrier sheet rolled up into a supply roll into which a multiplicity of final electrical identification devices are sealed and which is adhesive.

According to FIG. 12, with this method a great number of thin and flexible resonant members 70 can be produced which are encased in a continuous sheath. They can be either cut off individually from said continuous strip or, after a severing perforation 71 and provision with pressure sensitive adhesive 72 and delaminating film 73, can be flexibly transferred to articles by means of automatic roll-off dispensers.

Figure 10:
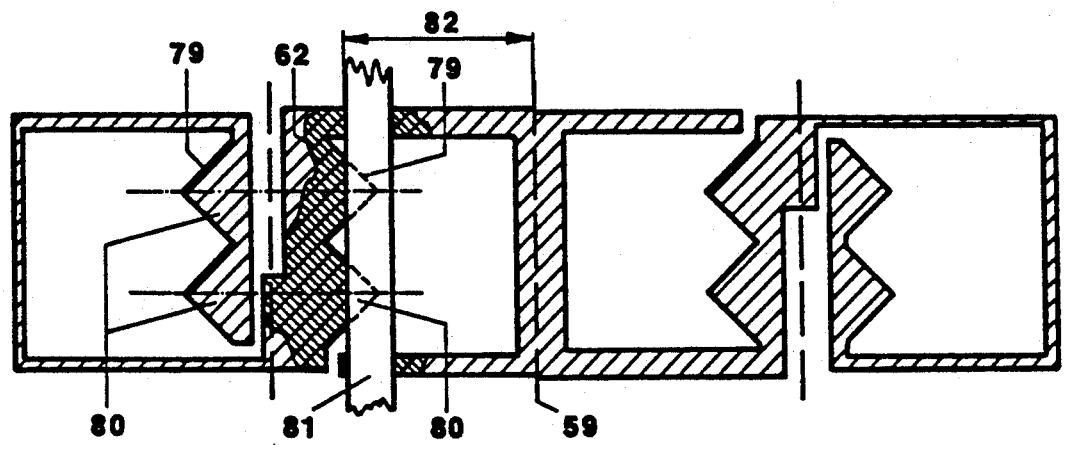

In a continuous manufacturing process of the described type the resonant frequency of the device can be maintained within predeterminable frequency limits regardless of any occurring variations of the properties of the dielectrics 45, 46 and 40, 41, 42, of the adhesive layer 62, or of the carrier sheet 56 and of any other process parameters in that, according to FIG. 10, contours 79 of capacitively active adjusting conductor strip portions 80 are provided obliquely relative to the direction of advance of the carrier sheet, and between said conductor strip portions 80 a continuous insulating tape 81 of sufficient width and having a rather low relative permittivity and sufficient thickness is inserted so as to extend in the direction of advance of the carrier sheet. Thereby the active circuit capacitance and thus the resonant frequency of the final device can be influenced in response to the track spacing 82 of said adjusting tape from the perforation line 59.

In this way a suitable closed control circuit which contactlessly detects the actual frequency of manufactured devices, continuously compares it with a predetermined set frequency, and the dynamic of which is tunable to the number of manufactured devices per unit of time, can control the maintenance of predetermined resonant frequency limits automatically via control of the track spacing.

The insertion of such an adusting tape 81 can be effected either by rolling it onto the still unfolded structure after application of the adhesive layer 62 by utilizing the adhesion of said very layer, as shown in FIG. 10, or can be effected in the same way after the first folding operation by utilizing selective adhesive properties of the carrier sheet, as indicated in FIGS. 8 and 9, depending on the desired adjusting sensitivity.

Figure 13:
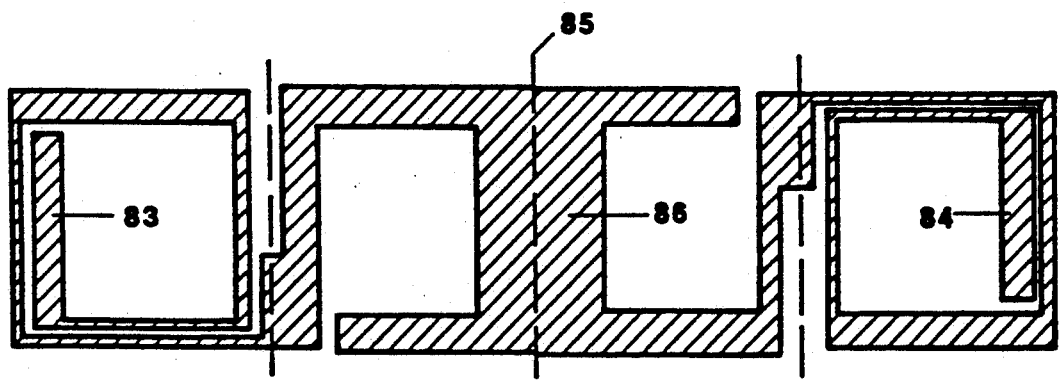
FIG. 13 is a plan view on a conductor strip structure developed into a plane for the manufacture of an outwardly shielded identification device with four superposed planes and increased inductance.

The inductance can be increased and the shielding effect improved while retaining the four-leaf principle shown in FIG. 13 by increasing the number of windings of the leaves inwardly disposed after folding. To this end the conductor strip portions 83 and 84 acting as capacitor coatings may be so arranged-that they come to lie below the two outwardly disposed halves of the central conductor strip 86 of the structure last folded along the line 85 which has the lowest coupling impedance. This further improves the stability of the resonant frequency against capacitive approach.

The same effect is achieved when there are More than four leaves to one structure. The possible form of a multi-leaf structure which may also be asymmetrically continued on both sides in meander-fashion, is illustrated in FIG. 14. The required stepping of the conductor strip widths is only sketched.

Two-leaf devices can be produced rapidly and especially simply by producing from a thin metal foil 87 provided with a suitable dielectric coating 88 a flat conductor strip structure 91 composed of two partial leaves 89 and 90, as illustrated in FIG. 15, fixing it on an adhesive or sealable carrier sheet 65a, and then folding the latter together with the conductor strip fixed thereto along a line of perforation 92 produced without pitch shift and continuously penetrating the conductor strip structure and the carrier sheet so that the dielectric coatings are encased between the conductor strips of the folded structure. Here, too, the principle of electric conductance through a zone of perforation along a fold line is applied. If the starting maternal is a metal foil 87 bearing no dielectric coating 88, a dielectric 93 must be inserted between the two partial leaves as shown in FIGS. 16 and 16a. In this case, too, a Thomson oscillating circuit with distributed capacitances is formed.

Trial samples showed that fixing by a special adhesive layer 62 of the dielectric layers 88 to one another or of the conductor strip 87 to a dielectric 93 to be inserted becomes unnecessary if the structure is enclosed all around in-the sheathing material 65 by a suitable sealing film 61.

In this embodiment, too, capacitor areas are most favorably disposed so that they are oriented lengthwise in winding direction, because in this way, as a component of the coil winding, they permit the maximum induction area with a minimum of field distortion.

If the superposed conductor strips are sufficiently large, special capacitor areas are unnecessary so that then the windings are open-ended, in the interior of the sheet structures.

Figure 19:
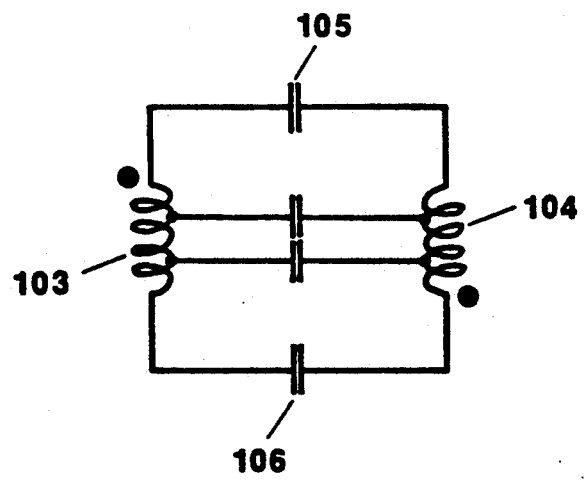
FIG. 19 is an equivalent circuit diagram of the embodiment of FIGS. 17 and 18.

If one departs from the principle of electrical condition through a perforated zone along a fold line and in the embodiment of FIG. 16 the electrically conductive connection along the perforation line 92 is separated one obtains a parallel resonant circuit, as shown in FIG. 19, with series arranged inductances 103 and 104 and series arranged capacitances 105 and 106 in that the capacitive coating becomes active as a serial capacitor 106 between the mutually insulated conductor strip halves 107 and 108 along the perforation line 92. In FIG. 19 also the distributed capacitances of the winding areas with respect to each other are indicated.

Such embodiment can be produced rapidly and simply, again with the application of the principle of unlike overlying conductor strip width for extensive frequency invariance relative to positioning inaccuracies, in that form a thin metal foil 87—which may already be provided with a suitable dielectric coating 88 on one side—two separate planar structures 109 and 110 are produced as shown in FIG. 17, and are fixed on an adhesive or sealable carrier sheet 65; in the same operational step the latter is continuously perforated without pitch shift between the structures, so that together with the conductor strip structures 109 and 110 positioned thereon—with a dielectric 93 inserted therebetween, if necessary—it may be folded along the resulting perforation line 111 so that the two conductor strip structures 109, and 110 lie one upon the other and are capacitively, rather than electrically, coupled through the insulating interlayer 88 or 93, as shown in FIGS. 18 and 18a, and the thus obtained resonant member is sealed on all sides within the carrier sheet 65 forming a protective sheath. In order to influence the resonant frequency, again an adjusting tape 81 is provided (FIG. 20) cooperating with adjusting areas 112, as explained in detail with reference to FIG. 10. The adjusting areas 112 are so constructed that there is approximately square response of the adjustment capacitance to the parallel shift of the adjustment tape 81, or linear response of the resonance frequency to said parallel shift.

Since the described identification device can be produced not only very rapidly and simply but also with a minimum of raw material waste, it is especially suitable for use in merchandise safeguarding identifying price tags.

Figure 21:
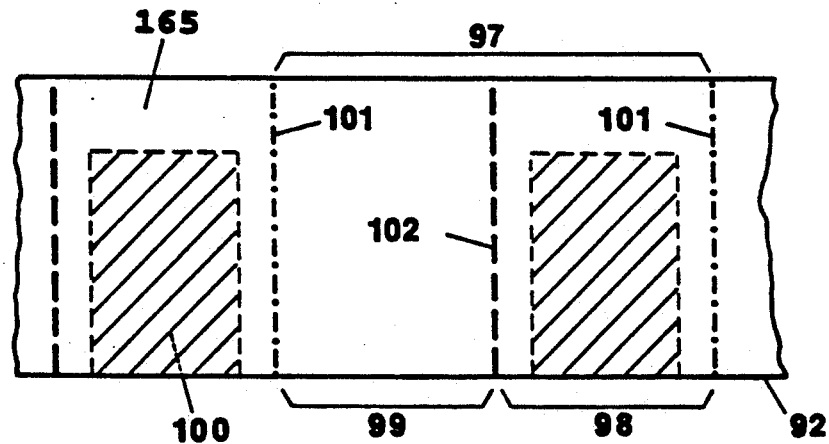
FIG. 21 shows a schematic plan view of a strip-shaped carrier alternately provided with an area carrying an identification device and a vacant area.

According to FIG. 21, to this end a data-bearing double price tag 97 for example—consisting of a cash register section 98 provided with such an identification device and a customer's section 99 without such a device—can be produced by using as production facilitating carrier 165 an accordingly preprinted sheathing material suited as a data-carrier medium, and by leaving adequate space between the structures fixed to said carrier so that, after folding along the perforation line 92 and sealing of the carrier, there alternate in succession one area provided with a resonant member 100 and one area without such a member. Thereafter this tape is provided with transverse perforations following the incorporated resonant members in predetermined spaced relation for separation of individual tags, and one transverse perforation 102 there-between for separating customer's and cash register sections.

In case merchandise and price data on such tags are not manually but automatically inputted into the cash register by means provided for this purpose, such a resonant member can also be contained in the customer's section, provided the customer's section is punched in a suitable place in the read-in apparatus directly after registration, and the resonant member in the interior thereof is thereby inactivated.

Since this device is not shielded against the environment, and merchandise safeguarding tags should be sized as small as possible, it may be that changes in the circuit capacitance and thus in the resonant frequency occur in case large areas thereof are covered by objects or body portions.

In order to minimize this effect, the following measures are taken according to preferred embodiments:

The sheathing material is made sufficiently thick, and the essential portion of the oscillating circuit capacitance is located at the periphery of the device, i.e. commencing in the capacitive coating between the first windings and concentrated along the line of perforation;

the ends of the coil are terminated with capacitor coatings of only relatively small area;

the relative permittivity of the dielectric is made as high, and the relative permittivity of the sheathing material is made as low as possible.

Figure 22:
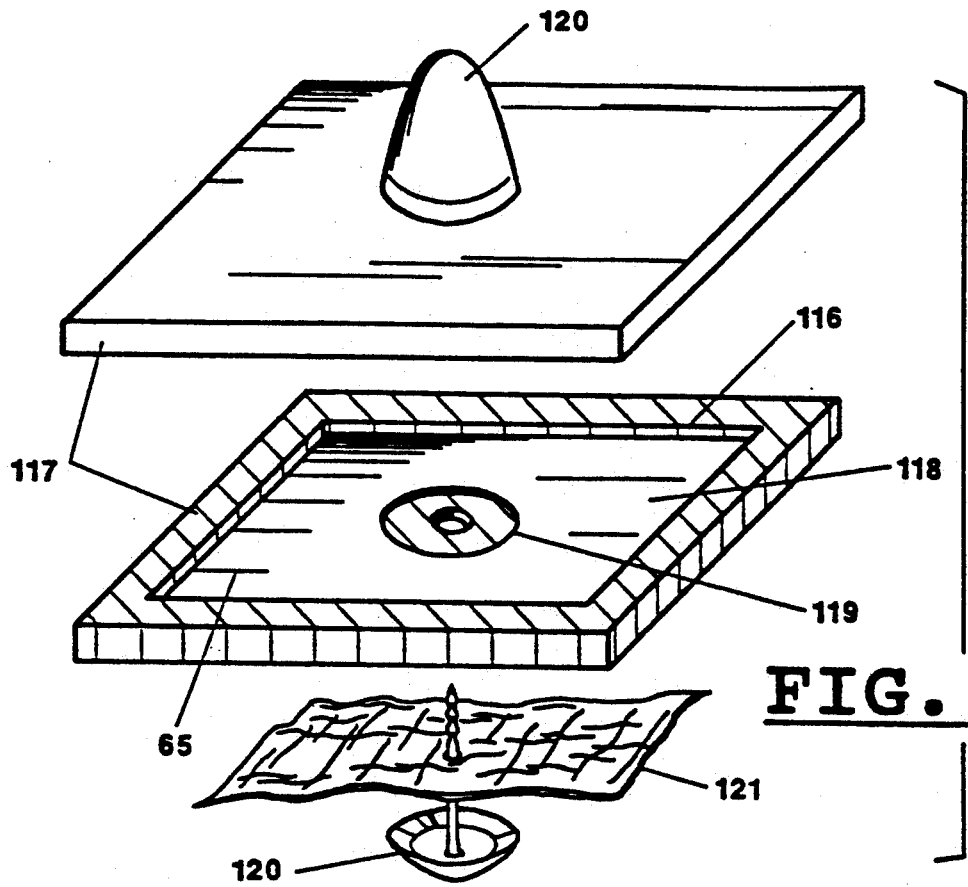
FIG. 22 shows an exploded view for explanation how an identification device of the invention can be affixed to an article be safeguarded.

As a component of electronic systems for theft detection of merchandise or for supervising the authorized access of persons conventional devices have been in use which comprise, in-a rigid housing essentially consisting of two parts, an oscillating circuit composed of a coil winding 1 of bare of insulated wire and a capacitor 2 of conventional design connected to the ends of the coil winding. The introduction of these parts in the hitherto customary way may be obviated in that, according to FIG. 22, one of the described resonant devices 118 is placed into an adequate flat recess 116 in the interior of a similarly designed casing 117; the paper or cardboardlike carrier sheath 65 of such a device can be provided with a perforation 119 within the encased resonant structure in order to receive a closing mechanism 120 that may be required for detachable mounting of the entire structure to garments 121.

Figure 23:
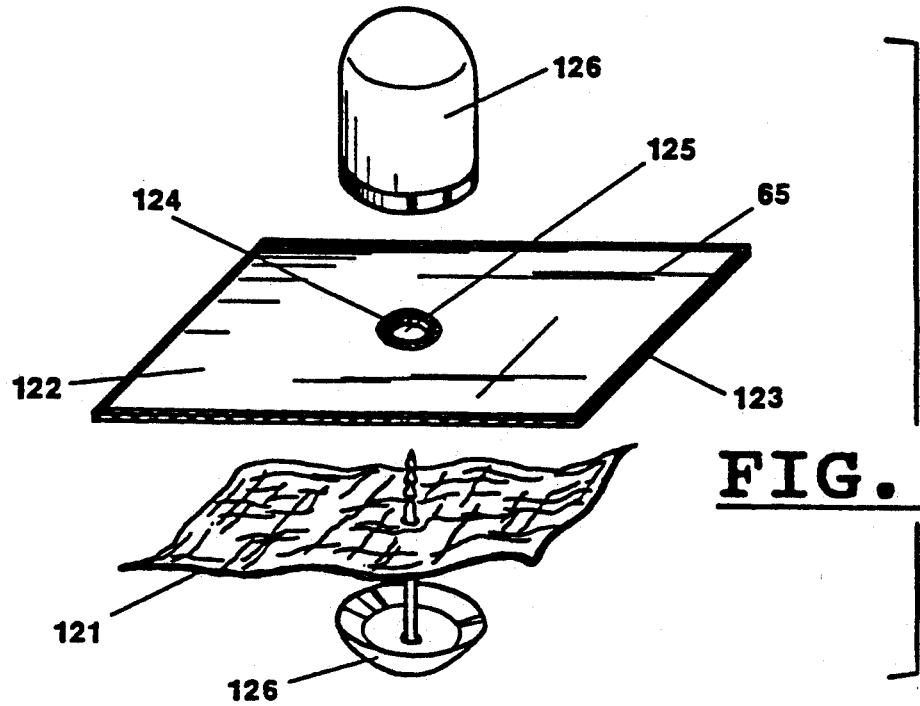
FIG. 23 is an exploded view of another embodiment of affixing an identification device to an article to be safeguarded.

If such a closing mechanism need not be inseparably connected to an identification device, and if the identification device itself is to be designed as a flexible, resistant, repeatedly usable tag 122, such a tag can be produced, according to FIG. 23, in that as production facilitating carrier 65—and thus as sheathing material of the resonant member—a sufficiently thick, tear-resistant material with bend-resistant reinforcement is used which can be sealed, if required, by a sealed seam 123 along the margins to render the device tear resistant.

A bore 125 in the inner area of such a tag whose margin is likewise reinforced by sealing 124 may permit detachable mounting to merchandise 121 with customary devices 126 suitable for this purpose.

All in all, various insulative spacing layers may be present and capacitively effective between mutually superposed conductor paths, at least one thereof being an adhesive layer. The practitioner will understand that, within the scope of the invention, a specific spacing layer construction shown in a specific figure of FIGS. 1-20 may be mixed or combined with other spacing layer constructions shown in other figures, whereas in any case at least one adhesive layer is present to co-perform a capacitive function in the LC marker construction.

Figure 24:
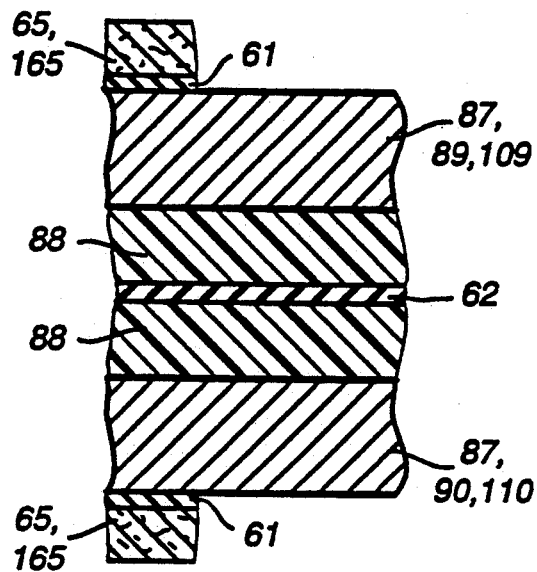
FIG. 24a is a schematic partial cross section through inductively and capacitively effective conductor paths and various spacing layers.
FIG. 24b is another schematic partial cross section through inductively and capacitively effective conductor paths and various spacing layers.
FIG. 24c is another schematic partial cross section through inductively and capacitively effective conductor paths and various spacing layers.
FIG. 24d is another schematic partial cross section through inductively and capacitively effective conductor paths and various spacing layers.
FIG. 24e is a schematic plan view of a most simple rectangular embodiment of the claimed LC marker construction.
Figure 24:
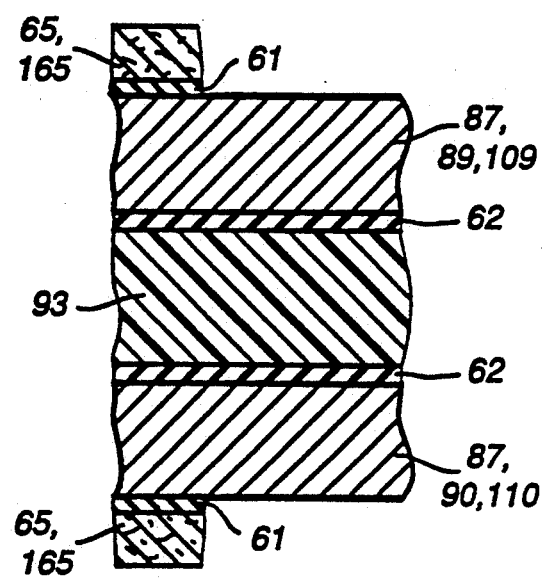
Figure 24:
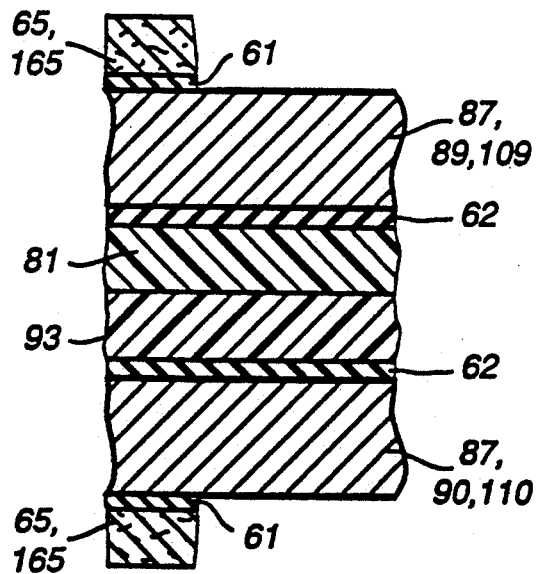
Figure 24:
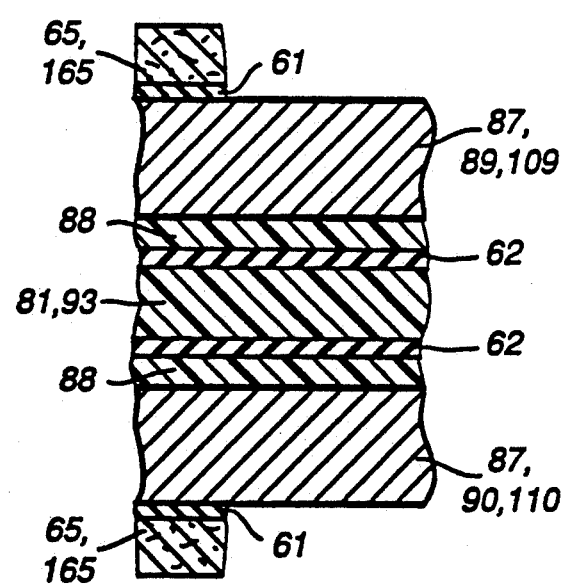
Figure 24:
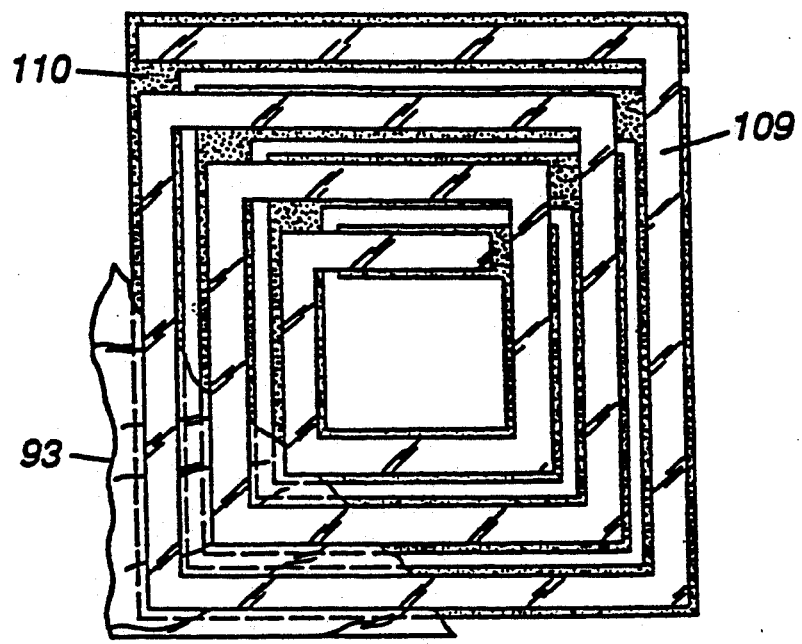

E.g., FIG. 24a illustrates, in a cross sectional view, a first capacitive situation between mutually superposed conductive paths 87, 89, 109 and 87, 90, 110 respectively. In this case the RF electrical field (not shown) routes e.g. from the upper conductor path 87, 89, 109 to the lower conductor path 87, 90, 110, by that it penetrates a first dielectric layer 88 in direct contact with the aforesaid upper conductor path, an adhesive layer 62, and a second dielectric layer 88 in direct contact with the aforesaid lower conductor path, wherein hence the double function of adhesive layer 62 is fixing the two dielectric layers together and capacitively contributing to the overall capacitance distributed along inductively reacting conductor paths. Also external fixing layers 61 and external cover sheets 65, 165 are fractionally shown so that the left portion of FIG. 24a may be considered as a fractional cross section thru a security tag in a place where an LC stripline of the LC marker construction routes.

One will see that FIG. 24a results from e.g. FIG. 18 and FIG. 18a in combination with FIG. 17. FIG. 18a shows an upper conductor path 87 of the upper pattern 109 above a dielectric layer 88, wherein path 87 and dielectric layer 88 are in a direct contact, as may be effected by connecting the dielectric layer 88 to conductor path 87 in whichever way. FIG. 17 shows two partial adhesive layers 62 connecting to upper and lower patterns 109 and 110, which layers may inseparably combine to a single central adhesive layer 62. Having two dielectric layers 88 may be a good choice, if upper and lower patterns should be generated in a like way or in all the same production step e.g. from all the same e.g.. dielectrically precoated metal foil. The mass production practitioner will appreciate that no need exists to provide two fractional adhesive layers 62 to combine to a single center adhesive layer 62 (of thus double thickness) between mutually superposed conductor paths, if no dielectric sheet 93 should be used.

As has been pointed out hereinabove, an adhesive layer 62 effective between mutually superposed conductor paths should be made extremely thin, which, in a practical production process, may be achieved easier if one single adhesive layer 62 is used, rather than two separate layers to connect to each other and thus add their thicknesses. In view of this one will understand that the practitioner has a multiple choice to create the electrical field related capacitive situation between mutually superposed conductor paths of FIG. 24a, depending on the way of production.

From the foregoing the following modification derives as obvious within the scope of the invention. According to the distributed LC stripline design philosophy, the higher a line capacitance per unit length is required the thinner the insulative layers between superposed conductor paths of constant widths can be made. Or, vice versa, for maintaining a specific overall resonator capacitance, the conductor paths can be made with a narrower width, the thinner the insulative spacing layer between mutually superposed conductor paths can be made. One will see e.g. from FIG. 18 and FIG. 18a, that in the right half of the scheme on FIG. 18 no dielectric sheet 93 will be necessary even in the particular case, the lower pattern 110 is produced from a blank metal foil, since at least a single dielectric layer 88—as exemplified in connection with the metal path 87 of upper pattern 109 and as obvious from FIG. 24a—would suffice to isolate the two counter turning spirals one from another. Hence, regarding this second capacitive situation, the practitioner will appreciate that more than one dielectric layer 88, 93 will be unnecessary in a minimum count solution for cheapest mass production of the LC marker construction, for the benefit of a minimized spacing and thus a maximized capacitance yield between mutually superposed conductor paths.

FIG. 24b illustrates a third capacitive situation between mutually superposed conductive paths 87, 89, 109 and 87, 90, 110 respectively. In this case the RF electrical field (not shown) routes e.g. from the upper conductor path 87, 89, 109 to the lower conductor path 87, 90, 110, by that it penetrates a first adhesive layer 62 in contact with the aforesaid upper conductor path, a dielectric layer 93, and a second adhesive layer 62 in contact with the aforesaid lower conductor path, wherein hence the double function of adhesive layers 62 is fixing the central dielectric layer 93 to both conductor paths and contributing to the overall capacitance distributed along inductively reacting conductor paths. Likewise, as optional members of e.g. a security tag, external fixing layers 61 and external cover sheets 65, 165 are indicated. One will recognize that this building scheme directly derives from FIGS. 2, 4, 7, 15, 17, and 18.

FIG. 24c illustrates a fourth capacitive situation between mutually superposed conductive paths 87, 89, 109 and 87, 90, 110 respectively. In this case the RF electrical field (not shown) routes e.g. from the upper conductor path 87, 89, 109 to the lower conductor path 87, 90, 110, by that it penetrates a first adhesive layer 62 in contact with the aforesaid upper conductor path, a first dielectric layer 81, a second dielectric layer 93 in contact with said first dielectric layer 81, and a second adhesive layer 62 in contact with the aforesaid lower conductor path. One will see that the double function of adhesive layers 62 is fixing the first dielectric layer 81 to the aforesaid upper conductor path and the second dielectric layer 93 to the aforesaid lower conductor path, respectively, and contributing to the overall capacitance distributed along inductively reacting conductor paths. Again, external fixing layers 61 and external cover sheets 65, 165 are fractionally illustrated so that the left portion of FIG. 24c could be considered as a fractional cross section thru a security tag in a place where an LC stripline of the LC marker construction routes. One will see that, within the scope and spirit of the invention, FIG. 24c derives from FIG. 16 and FIGS. 8–10, or FIGS. 18 and 20, respectively.

FIG. 24d illustrates a fifth capacitive situation between mutually superposed conductive paths 87, 89, 109 and 87, 90, 110 respectively. In this case the RF electrical field (not shown) routes e.g. from the upper conductor path 87, 89, 109 to the lower conductor path 87, 90, 110, by that it penetrates a first dielectric layer 88 in contact with the aforesaid upper conductor path, a first adhesive layer 62 in contact with aforesaid first dielectric layer 88, a central dielectric layer 81 or 93, a second adhesive layer 62 in contact with aforesaid central dielectric layer 81 or 93, and a second dielectric layer 88 in contact both with aforesaid second adhesive layer 62 and the aforesaid lower conductor path, respectively. One will see that the double function of adhesive layers 62 is fixing the first dielectric layer 88 to the central dielectric layer 81, 93, and the latter layer to the second dielectric layer 88, respectively, and contributing to the overall capacitance distributed along inductively reacting conductor paths. Likewise, as optional members of e.g. a security tag, external fixing layers 61 and external cover sheets 65, 165 are indicated. One will recognize that this building scheme results from FIGS. 16, 16, 16a, 17, 18, and 18a.

It is noted, that a dielectric sheet 93 may offer some advantages in production in all cases in which dielectric layers 88 are provided ultra thin, so that short circuits between mutually superposed conductor paths particularly in turn-to-turn transition zones of the conductive spirals could result. Such ultra thin coatings 88 may be advantageous in combination with certain roto-cutting or stamping tools for prolonging tool lifetime by that such coating can perform as a greasing or lubricating means between a shearing tool and the supporting metal layer under cutting conditions. E.g., a very thin high-density polyethylene layer deposited on copper proved to be very effective in this respect.

Lastly, FIG. 24e illustrates one of the simplest LC marker constructions within the scope of the present invention, wherein two counter turning metal spirals 109 and 110 and a dielectric sheet 93 are used, the latter definitely and reliably spacing the spirals so that they cannot electrically connect to each other. For clearness, capacitively engaging adhesive layer(s) 62 is/are not shown here. It will be recognize from this figure that horizontally routing and superposing conductor paths have same lengths, whereas vertically routing and superposing conductor paths left and right have different lengths. It will also be recognized, that the widths of mutually superposing conductor paths differ, and that the shape of the upper and lower paths differ at least in view of their opposite curvatures.

The various features and advantages of the invention are thought to be clear from the foregoing description. However, various other features and advantages not specifically enumerated will undoubtedly occur to those versed in the art, as likewise will many variations and modifications of the preferred embodiments illustrated, all of which may be achieved without departing from the spirit and scope of the invention as defined by the following claims.

I claim:

1. An LC marker construction useful as an electromagnetically interrogatable transponder means in electronic security systems, comprising:
   An inductive element (103, 104) formed of planar conductor paths (47 to 54, 83, 84, 86; 87 of 89 and 90; 87 of 109 and 110) and a capacitive element (105, 106) formed of mutually superposed conductor paths (37, 39; 47 to 54, 83, 84, 86; 87 of 89 and 90; 87 of 109 and 110) and at least one dielectric layer (38; 40, 41, 42; 45, 46; 81; 88, 93) and at least one adhesive layer (62) spaced therebetween, said capacitive element and said inductive element forming a resonant circuit,
   said conductor paths (47 to 54, 83, 84, 86; 87 of 89 and 90; 87 of 109 and 110) being so arranged as to constitute a stripline construction (37, 38, 39), wherein conductor paths (37, 39; 47 to 54, 83, 84, 86; 87 of 89 and 90; 87 of 109 and 110) forming the capacitive element (105, 106) at least in part are identical with conductor paths (37, 39; 47 to 54, 83, 84, 86; 87 of 89 and 90; 87 of 109 and 110) forming the inductive element (103, 104), and wherein
   said at least one adhesive layer is a an integral working element of said stripline construction which, by virtue of its dielectric permittivity and thickness, codetermines the resonant response of the LC marker construction.

2. The LC marker construction as set forth in claim 1, wherein
   a stable pairwise superposition of conductor paths forming stripline segments is effected by the fixing power of an adhesive material (62) present and effective at least within projected spaces between mutually superposed conductor paths, and wherein thus over at least part of the area occupied by the entire construction within cross sections of stripline segments a sequence of layers exists which includes at least the following layers;
   path segment (53, 47; 54, 48; 87 of 89, 109) forming part of an upper conductor path pattern (31; 34; 89; 109);
   adhesive layer (62);
   dielectric layer (40; 41; 93);
   adhesive layer (62);
   path segment (49, 51; 50, 52; 87 of 90, 110) forming part of a lower conductor path pattern (32; 33; 90; 110).

3. The LC marker construction as set forth in claim 1, wherein
   conductor paths (47 to 54, 83, 84, 86; 87 of 89 and 90; 87 of 109 and 110) in mutually superposed planes have at least one of
   different shapes;
   different dimensions;
   different path widths.

4. The LC marker construction as set forth in claim 1, wherein
   conductor paths (47 to 54, 83, 84, 86; 87 of 89 and 90; 87 of 109 and 110) form at least two individual planar conductor path patterns (31, 34; 89, 90; 109, 110) having the shape of spiral paths (in 31 between 83 and 86, in 34 between 84 and 86; 89, 90; 109, 110) each having a plurality of turns which turn in opposite direction with respect to each other, if viewed from the same side, in an aligned superposition turn by turn.

5. The LC marker construction as set forth in claim 4, wherein at least two mutually superposed terminal segments (47, 48; 83, 84; inner end of 89, inner end of 90; 112, 113; 114, 115) of said spiral paths (31, 34; 89, 90; 109, 110) are designed with greater areas per unit length than are designed the other conductor path segments of said spiral paths.

6. The LC marker construction as est forth in claim 4, wherein
said oppositely turning spiral paths (31, 34; 89 and 90, 109 and 110) are open-ended towards their spiral center, i.e. without termination paths being provided which produce a predominantly capacitive effect.

7. The LC marker construction as set forth in claim 1, wherein
said at least one dielectric layer (38; 40, 41, 42; 93) is configured as a substantially continuous sheet (40, 41, 42; 93).

8. The LC marker construction as set forth in claim 7, wherein
said substantially continuous sheet (40, 41, 42; 93) has a recessed opening (119) in an area not occupied by said conductor paths (47 to 54, 83, 84, 86; 87 of 89 and 90; 87 of 109 and 110).

9. The LC marker construction as set forth in claim 1, wherein
said at least one dielectric layer (40, 41, 42; 81; 93) lies between at least a portion of said mutually superposed conductor paths (31, 32, 33, 34; 89, 90; 109, 110) and also extends over regions not occupied by conductor paths.

10. The LC marker construction as set forth in claim 1, wherein
particular segments (109, 108) of mutually superposing conductor paths (89, 90) are provided with a conductive connection between each other, so that the entirety of all conductive paths forms a route substantially having an uniform turn direction to form, in a coil manner, multiple turns.

11. The LC marker construction as est forth in claim 10, wherein
the LC marker construction is provided in a substantially endless repetition so as to form a coextending multiplicity of individual LC marker constructions separated from one another by severing cuts (71; 101), and wherein
one face of said multiplicity of LC marker constructions is provided with a self-adhesive affixing layer (72) topped with a protective peel-off film or paper (73) to be removed for affixing the LC marker construction to an object.

12. The LC marker construction as set forth in claim 1, wherein
said stripline construction is adhered to at least one flexible, electrically insulative carrier sheet (65, 165).

13. The LC marker construction as set forth in claim 1, wherein
the construction is provided with a recess (119, 125) in its inner region which is not occupied by conductor paths (47 to 54, 83 to 86; 89, 90; 109, 110).

14. The LC marker construction as set forth in claim 1, wherein
said stripline construction is embedded in a paper- or cardboard-like cover material (165) having a carrier function.

15. The LC marker construction as set forth in claim 1, wherein
at least one face of the LC marker construction (70; 100; 118; 122) is provided with at least one of printed information;
data.

16. The LC marker construction as set forth in claim 1, wherein
said LC marker construction (97) comprises a customer section (99) and a cashier section (98), both sections separably (102) joining each another, and wherein said resonant circuit (100) is provided at least in one of said sections (98, 99).

17. The use of the LC marker construction according to claim 16, wherein
said customer section and cashier section are normally torn off one from another at a cashier's site.

18. The use of the LC marker construction as set forth in claim 1, wherein
the LC marker construction(70; 100; 118, 122) is utilized as an essential part of an electronic identification system, being electromagnetically interrogated for its RF frequency response.

19. The use of the LC marker construction as set forth in claim 1, wherein
data are deposited on at least one face thereof, and wherein
said data relate to an article to which said LC marker construction is affixed.

20. The use of the LC marker construction according to claim 1, wherein
the LC marker construction can be punched in a suitable place for thus being rendered inoperative to avoid its further detection.

21. The LC marker construction as set forth in claim 1, wherein
a stable pairwise superposition of conductor paths forming stripline segments is effected by the fixing power of an adhesive material (62) present and effective at least within projected spaces between mutually superposed conductor paths, and wherein thus over at least part of the area occupied by the entire construction within cross sections of stripline segments a sequence of layers exists which includes at least the following layers:
path segment (53, 47; 54, 48; 87 of 89, 109) forming part of an upper conductor path pattern (31; 34; 89; 109);
dielectric layer (88);
adhesive layer (62);
path segment (49, 51; 50, 52; 87 of 90, 110) forming part of a lower conductor path pattern (32; 33; 90; 110).

22. The LC marker construction as set forth in claim 3, wherein
a stable pairwise superposition of conductor paths forming stripline segments is effected by the fixing power of an adhesive material (62) present and effective at least within projected spaces between mutually superposed conductor paths, and wherein thus over at least part of the area occupied by the entire construction within cross sections of stripline segments a sequence of layers exists which includes at least the following layers:
path segment (53, 47; 54, 48; 87 of 89, 109) forming part of an upper conductor path pattern (31; 34; 89; 109);
dielectric layer (88);
first adhesive layer (62);
second adhesive layer (62);

dielectric layer (88);
path segment (49, 51; 50, 52; 87 of 90, 110) forming part of a lower conductor path pattern (32; 33; 90; 110).

23. The LC marker construction as set forth in claim 22, wherein
said first and second adhesive layers (62) adhesively combine with one another to a fixing center layer.

24. The LC marker construction as set forth in claim 1, wherein
a stable pairwise superposition of conductor paths forming stripline segments is effected by the fixing power of an adhesive material (62) present and effective at least within projected spaces between mutually superposed conductor paths, and wherein thus over at least part of the area occupied by the entire construction within cross sections of stripline segments a sequence of layers exists which includes at least the following layers:
path segment (53, 47; 54, 48; 87 of 89, 109) forming part of an upper conductor path pattern (31; 34; 89; 109);
adhesive layer (62);
first dielectric layer (81);
second dielectric layer (93);
adhesive layer (62);
path segment (49, 51; 50, 52; 87 of 90, 110) forming part of a lower conductor path pattern (32; 33; 90; 110).

25. The LC marker construction as set forth in claim 1, wherein
a stable pairwise superposition of conductor paths forming stripline segments is effected by the fixing power of an adhesive material (62) present and effective at least within projected spaces between mutually superposed conductor paths, and wherein thus over at least part of the area occupied by the entire construction within cross sections of stripline segments a sequence of layers exists which includes at least the following layers:
path segment (53, 47; 54, 48; 87 of 89, 109) forming part of an upper conductor path pattern (31; 34; 89; 109);
first dielectric layer (88);
adhesive layer (62);
second dielectric layer (81; 93)
adhesive layer (62);
third dielectric layer (88);
path segment (49, 51; 50, 52; 87 of 90, 110) forming part of a lower conductor path pattern (32; 33; 90; 110).

26. The LC marker construction as set forth in claim 1, wherein
said stripline construction is trapped between two flexible sheets of a cover material (65, 165) having a carrier function.

27. The LC marker construction as set forth in claim 26, wherein
said stripline construction is fixed between said two flexible sheets of a cover material (65, 165) at least by a layer of a sealing or fixing material (61) provided and effective particularly between outwardly disposed surfaces of conductor paths (87; 89, 90; 109, 110) of said stripline construction and the respective one of said two flexible sheets.

28. The LC marker construction as set forth in claim 27, wherein
said sealing or fixing material (61) is not same as the material from which said at least one adhesive layer (62) is made.

29. The LC marker construction as set forth in claim 1, wherein
said LC marker construction has a square to rectangular shape and wherein
at least one layer is provided having the shape of a strip, which strip is arranged to cross conductor paths arranged substantially in parallel to one of both edge directions of the construction and extends, between respective two opposing edges, over the full length or width of the construction.

30. A planar LC marker construction useful as an electromagnetically interrogatable transponder means, said construction comprising:
a first conductive element consisting of various first conductor strip portions which form a first conductive spiral pattern (89, 109; 87) having first multiple turns,
a second conductive element consisting of various second conductor strip portions which form a second conductive spiral pattern (90, 110; 87) having second multiple turns, and wherein
said first and second conductive spiral patterns turn in opposite directions with respect to each other when both are viewed from the same side, and are substantially aligned to each other, so as to substantially cover each other, turn by turn, and so that at least the major part of all conductor strip portions, on combination with at least one insulative spacing layer, form non-shorted stripline portions, each of which has a distributed line inductance and a distributed line capacitance which contribute to a respective total inductance and capacitance of the LC marker construction, and wherein
said at least one insulative spacing layer comprises at least one dielectric layer (88; 93) having first and second surfaces; and wherein
at least within the projected spaces between opposing face portions of superposing conductor strip portions, at least one additional layer (62) is provided for fixing and keeping in a mutual alignment with each other said conductive spiral patterns and said at least one dielectric layer,
so that at least a part of said first and second conductor strip portions are spaced from each other by at least two different layers.

31. The LC marker construction according to claim 30, wherein
said first and second conductive spiral patterns (89, 109; 90, 110; 87) are generally aligned face-to-face except in the small zones of turn-to-turn transitions.

32. The LC marker construction according to claim 30, wherein
said conductive spiral patterns (89, 109; 90, 110; 87) have been cut out from a metal foil.

33. The LC marker construction according to claim 30, wherein
first and second mutually opposing conductor strip portions have substantially different strip widths.

34. The LC marker construction according to claim 30, wherein
said first and second mutually opposing conductor strip portions have different strip widths, except the outermost first and second conductor strips.

35. The LC marker construction according to claim 30, wherein at least those first and second conductor strip portions which are not part of respective first and second outermost turns, have substantially constant strip widths throughout the total lengths of the first and second spiral pattern routes.

36. The LC marker construction according to claim 30, wherein
said first and second conductor strip portions have substantially constant individual strip widths, except the innermost first and second terminal strip portions which have greater widths and thus more area per unit length.

37. The LC marker construction according to claim 30, wherein
said first and second conductor strip portions have substantially constant strip widths throughout the total lengths of first and second spiral pattern routes, except at least one strip portion arranged in the outermost turn of each of said conductive spiral patterns.

38. The LC marker construction according to claim 30, wherein
said first and second conductor strip portions have substantially constant strip widths throughout the total lengths of first and second spiral pattern routes, except the two innermost strip portions and at least one strip portion arranged in the outermost turn of each of said conductive spiral patterns.

39. The LC marker construction according to claim 30, wherein
said first conductive spiral pattern (89, 109; 87) and said second conductive spiral pattern (90, 110; 87) have substantially equal areas.

40. The LC marker construction according to claim 30, wherein
said at least one additional layer (62) is thinner than the other layers of the LC marker construction.

41. The LC marker construction according to claim 30, wherein
said first and second multiple turns route, from an innermost conductor strip portion (112, 113) to an outermost conductor strip portion (107, 108; 114, 115) in a substantially rectangular manner.

42. The LC marker construction according to claim 30, wherein
said at least one dielectric layer is substantially formed of a first and a second dielectric layer (88) bonding to respective facing surfaces of said first and second conductive spiral patterns (89, 109; 90, 110; 87), and wherein
said at least one additional layer is a central adhesive layer (62 twice) which adheres to both opposing surfaces of said first and second dielectric layers (88).

43. The LC marker construction according to claim 30, wherein
said first and second conductive spiral patterns (89, 90) are conductively connected with one another.

44. The LC marker construction according to claim 43, wherein
said conductive connection is not through said at least one dielectric layer (88; 93).

45. The LC marker construction according to claim 43, wherein
first and second conductor strip portions (107, 108) of respective outermost first and second turns of said conductive spiral patterns (89, 90) are provided with an electrical short circuit connection with each other, any capacitance between which connected conductor strip portions thus being short circuited so that it cannot substantially contribute to said total capacitance of the LC marker construction.

46. The LC marker construction according to claim 45, wherein
said electrical short circuit connection of said first and second conductor strip portions (107, 108) of respective outermost turns of said first and second conductive spiral patterns (89, 90) is a multiple connection formed of various individual connections provided substantially in succession one to another along a line in the direction in which said first and second conductor strip portions (107, 108) extend.

47. The LC marker construction according to claim 45, wherein
said electrical short circuit connection of said first and second conductor strip portions (107, 108) of respective outermost turns of said first and second conductive spiral patterns (89, 90) is inherently provided in that both patterns are formed by portions of an integral conductive pattern.

48. The LC marker construction according to claim 47, wherein
said electrical short circuit connection is a multiple connection in that a plurality of individual connections between said first and second conductor strip portions (107, 108) is rendered between repetitive perforation cuts along a line in the direction in which said first and second conductor strip portions (107, 108) extend.

49. The LC marker construction according to claim 30, wherein
said at least one dielectric layer configures as an insulative sheet (93), which sheet extends, between said first and second conductive spiral patterns, at least over all portions of these patterns, which definitely contribute, by virtue of an electrical isolation one from each other, to said total capacitance of the LC construction, and wherein
said at least one additional layer are first and second adhesive layers (62) provided at least on opposing surfaces of said first and second conductive spiral patterns, respectively, and wherein
said insulative sheet is trapped and fixed between said conductive spiral patterns by virtue of said two adhesive layers (62) effective between said pattern portions and said sheet.

50. The LC marker construction according to claim 49, wherein
said first and second adhesive layers (62) have substantially the same thicknesses.

51. The LC marker construction according to claim 49, wherein
first and second conductor strip portions (107, 108) of respective outermost first and second turns of said conductive spiral patterns (89, 90) are provided with an electrical short circuit connection with each other, any capacitance between which connected conductor strip portions thus being short circuited so that it cannot substantially contribute to said total capacitance of the LC marker construction.

52. The LC marker construction according to claim 51, wherein said electrical short circuit connection of said first and second conductor strip portions (107, 108) of respective outermost turns of said first and second conductive spiral patterns (89, 90) is a multiple connection formed of various individual connections provided substantially in succession one to another along a line in the direction in which said first and second conductor strip portions (107, 108) extend.

53. The LC marker construction according to claim 52, wherein
said electrical short circuit connection is a multiple connection in that a plurality of individual connections between said first and second conductor strip portions (107, 108) is rendered between repetitive perforation cuts along a line (92) in the direction in which said first and second conductor strip portions (107, 108) extend.

54. The LC marker construction according to claim 51, wherein
said electrical short circuit connection of said first and second conductor strip portions (107, 108) of respective outermost turns of said first and second conductive spiral patterns (89, 90) is inherently provided in that both patterns are formed by portions of an integral conductive pattern.

55. The LC marker construction according to claim 51, wherein
mutually superposed first and second conductor strip portions which are electrically isolated from one another, and thus are not in an electrical short circuit connection with each other, are spaced by a first adhesive layer (62), a dielectric sheet (93), and a second adhesive layer (62), and wherein
mutually superposed first and second conductor strip portions (107, 108), which are in an electrical short circuit connection with each other, at least over a part of their facing surfaces, are spaced by adhesive material (62) only.

56. The LC marker construction according to claim 51, wherein
said electrical short circuit connection is not through said dielectric sheet (93).

57. The LC marker construction according to claim 51, wherein
said electrical short circuit connection is exterior (around the edge) of said dielectric sheet (93).

58. The LC marker construction according to claim 49, wherein
a certain area in the center region of said dielectric sheet (93) is cut out so as to leave an opening (125).

59. The LC marker construction according to claim 30, wherein
said first conductive element and said second conductive element, and at least one dielectric layer and at least one additional layer effective therebetween, are sealed or adhesively trapped between two insulative cover sheets (65) by aid of additional fixing means (61).

60. The LC marker construction according to claim 57, wherein
a certain area in the center region of the construction is cut out so as to leave an opening (125).

61. The LC marker construction according to claim 30, wherein
a stripe of insulative material (81) is arranged so as to extend over all turns of said spiral conductive patterns across the full LC marker construction width or length.

62. The use of the LC marker construction according to claim 30 in a security tag which is at least one of
paperface-like;
cardboard-like;
tear-resistant;
bend-resistively reinforced;
sealed.

63. The use of the LC marker construction according to claim 30 in at least one of
a tag for articles' theft detection;
a merchandise tag carrying price data and/or printed information;
a data carrier tag;
a self-adhesively fitted tag;
a data carrying dual-section tag (97), on at least one section (98) thereof the LC marker construction being provided;
an access control tag.

64. The use of the LC marker construction according to claim 30 in a tag for an electronic security system, wherein
said LC marker construction is used at least in one of one-time tags and recirculation tags.

65. A planar LC marker construction for forming an electromagnetically detectable identification device, said construction comprising:
a dielectric sheet (93), on either surfaces of which sheet being affixed, by means of thin adhesive layers (62), a planar conductive multi-turn spiral path (89, 90; 109, 110) each turn of which forms a substantially closed loop and is in substantial registration face-to-face with an opposing turn of the spiral path on the opposite surface (except in the small zones of turn-to-turn transitions), said multi-turn spiral paths being oppositely wound with respect to each other when both are viewed from the same side of said sheet (93) to thereby form a series of closed loops having both inductive and distributed capacitive components which cause a resonating capability of the LC marker construction.

66. The LC marker construction according to claim 65, wherein
said oppositely wound planar conductive multi-turn spiral paths (89, 90; 109, 110) have been cut out from a metal foil.

67. The LC marker construction according to claim 65, wherein
said oppositely wound planar conductive multi-turn spiral paths (89, 90; 109, 110) have substantially different strip widths.

68. The LC marker construction according to claim 65, wherein
said oppositely wound planar conductive multi-turn spiral paths (89, 90; 109, 110) have different strip widths, except their outermost terminal path portions.

69. The LC marker construction according to claim 65, wherein
at least those portions of said planar conductive multi-turn spiral paths (89, 90; 109, 110), which are not part of their respective outermost turns, have substantially constant path widths throughout the lengths of said spiral path routes.

70. The LC marker construction according to claim 65, wherein said planar conductive multi-turn spiral paths (89, 90; 109, 110) have substantially constant individual path widths, except the innermost terminal path portions which have greater widths and thus more area per unit length.

71. The LC marker construction according to claim 65, wherein
said planar conductive multi-turn spiral paths (89, 90) are conductively connected with one another.

72. The LC marker construction according to claim 65, wherein
the outermost terminal path portions (107, 108) of said planar conductive multi-turn spiral paths (89, 90) at least in part are not affixed on said sheet (93) but directly adhere one to another by means of an adhesive material (62) spaced therebetween, and have at least one electrically conductive connection with one another, which connection is not through said sheet.

73. The use of the LC marker construction according to claim 65 in a security tag which is at least one of
paperface-like;
cardboard-like;
tear-resistant;
bend-resistively reinforced;
sealed.

74. The use of the LC marker construction according to claim 65 in at least one of
a tag for articles' theft detection;
a merchandise tag carrying price data and/or printed information;
a data carrier tag;
a self-adhesively fitted tag;
a data carrying dual-section tag (97), on at least one section (98) thereof the LC marker construction being provided;
an access control tag.

75. The use of the LC marker construction according to claim 65 in a tag for an electronic security system, wherein
said LC marker construction is used at least in one of one-time tags and recirculation tags.

76. The LC marker construction as set forth in claim 65, wherein
said LC marker construction has a square to rectangular shape and wherein
at least one layer is provided having the shape of a strip, which strip is arranged to substantially cross spiral path segments arranged substantially in parallel to one of both edge directions of the construction and extends, between respective two opposing edges, over the full length or width of the construction.

77. A planar LC marker construction useful as an electromagnetically interrogatable transponder means, said construction comprising:
a first conductive element consisting of various first conductor strip portions which form a first conductive spiral pattern (89, 109; 87) having first multiple turns,
a second conductive element consisting of various second conductor strip portions which form a second conductive spiral pattern (90, 110; 87) having second multiple turns, and wherein
said first and second conductive spiral patterns turn in opposite directions with respect to each other when both are viewed from the same side, and are substantially aligned to each other, so as to substantially cover each other face-to-face and turn by turn, except in small zones of turn-to-turn transitions, so that at least the major part of all conductor strip portions, in combination with at least one dielectric spacing layer (88; 93) and at least one additional layer (62) present at least in projected spaces between mutually opposing first and second conductor strip portions, form non-shorted stripline portions each of which having a distributed line inductance and a distributed line capacitance which contribute to a respective total inductance and total capacitance and thus to a resonating capability of the LC marker construction, and wherein
said at least one additional layer (62) has at least one of adhering and sealing capabilities for fixing and keeping in a mutual alignment with each other said conductive spiral patterns and said at least one dielectric layer.

78. The LC marker construction according to claim 77, wherein
said conductive spiral patterns (89, 109; 90, 110; 87) have been cut out from a metal foil.

79. The LC marker construction according to claim 77, wherein
first and second mutually opposing conductor strip portions have substantially different strip widths.

80. The LC marker construction according to claim 77, wherein
said first and second mutually opposing conductor strip portions have different strip widths, except the outermost first and second conductor strips.

81. The LC marker construction according to claim 77, wherein
at least those first and second conductor strip portions which are not part of respective first and second outermost turns, have substantially constant strip widths throughout the total lengths of first and second spiral pattern routes.

82. The LC marker construction according to claim 77, wherein
said first and second conductor strip portions have substantially constant individual strip widths, except the innermost first and second terminal strip portions which have greater widths and thus more area per unit length.

83. The LC marker construction according to claim 77, wherein
said first and second conductor strip portions have substantially constant strip widths throughout the total lengths of first and second spiral pattern routes, except the two innermost strip portions and at least one strip portion arranged in the outermost turn of each of said conductive spiral patterns.

84. The LC marker construction according to claim 77, wherein
said first and second conductive spiral patterns (89, 90) are conductively connected with one another.

85. The LC marker construction according to claim 84, wherein
said conductive connection is not through said at least one dielectric layer (88; 93).

86. The LC marker construction according to claim 77, wherein
first and second conductor strip portions (107, 108) of respective outermost first and second turns of said conductive spiral patterns (89, 90) are provided with an electrical short circuit connection with each other, any capacitance between which connected conductor strip portions thus being short circuited so that it cannot substantially contribute to said total capacitance of the LC marker construction.

87. The use of the LC marker construction according to claim 77 in a security tag which is at least one of
  paperface-like;
  cardboard-like;
  tear-resistant;
  bend-resistively reinforced;
  sealed.

88. The use of the LC marker construction according to claim 77 in at least one of
  a tag for articles' theft detection;
  a merchandise tag carrying price data and/or printed information;
  a data carrier tag;
  a self-adhesively fitted tag;
  a data carrying dual-section tag (97), on at least one section (98) thereof the LC marker construction being provided;
  an access control tag.

89. The use of the LC marker construction according to claim 77 in a tag for an electronic security system, wherein
  said LC marker construction is used at least in one of one-time tags and recirculation tags.

90. The LC marker construction as set forth in claim 77, wherein
  a stable pairwise superposition of conductor strip portions forming stripline segments is effected by the fixing power of an adhesive material (62) present and effective at least within projected spaces between mutually superposed conductor strip portions, and wherein thus over at least part of the area occupied by the entire construction within cross sections of stripline segments a sequence of layers exists which includes at least the following layers;
  conductor strip portion forming part of the first conductive spiral pattern (89, 109; 87);
  adhesive layer (62);
  dielectric layer (93);
  adhesive layer (62);
  conductor strip portion forming part of the second conductive spiral pattern (90, 110; 87).

91. The LC marker construction as set forth in claim 77, wherein
  a stable pairwise superposition of conductor strip portions forming stripline segments is effected by the fixing power of an adhesive material (62) present and effective at least within projected spaces between mutually superposed conductor strip portions, and wherein thus over at least part of the area occupied by the entire construction within cross sections of stripline segments a sequence of layers exists which includes at least the following layers:
  conductor strip portion forming part of the first conductive spiral pattern (89, 109; 87);
  dielectric layer (88);
  adhesive layer (62);
  dielectric layer (88);
  conductor strip portion forming part of the second conductive spiral pattern (90, 110; 87).

92. The LC marker construction as set forth in claim 91, wherein
  said first and second adhesive layers (62) adhesively combine with one another to a fixing center layer.

93. The LC marker construction as est forth in claim 77, wherein
  a stable pairwise superposition of conductor strip portions forming stripline segments is effected by the fixing power of an adhesive material (62) present and effective at least within projected spaces between mutually superposed conductor strip portions, and wherein thus over at least part of the area occupied by the entire construction within cross sections of stripline segments a sequence of layers exists which includes at least the following layers:
  conductor strip portion forming part of the first conductive spiral pattern (89, 109; 87);
  dielectric layer (88);
  first adhesive layer (62);
  second adhesive layer (62);
  dielectric layer (88);
  conductor strip portion forming part of the second conductive spiral pattern (90, 110; 87).

94. The LC marker construction as set forth in claim 77, wherein
  a stable pairwise superposition of conductor strip portions forming stripline segments is effected by the fixing power of an adhesive material (62) present and effective at least within projected spaces between mutually superposed conductor strip portions, and wherein thus over at least part of the area occupied by the entire construction within cross sections of stripline segments a sequence of layers exists which includes at least the following layers:
  conductor strip portion forming part of the first conductive spiral pattern (89, 109; 87);
  adhesive layer (62);
  first dielectric layer (81);
  second dielectric layer (93);
  adhesive layer (62);
  conductor strip portion forming part of the second conductive spiral pattern (90, 110; 87).

95. The LC marker construction as set forth in claim 77, wherein
  a stable pairwise superposition of conductor strip portions forming stripline segments is effected by the fixing power of an adhesive material (62) present and effective at least within projected spaces between mutually superposed conductor strip portions, and wherein thus over at least part of the area occupied by the entire construction within cross sections of stripline segments a sequence of layers exists which includes at least the following layers:
  conductor strip portion forming part of the first conductive spiral pattern (89, 109; 87);
  first dielectric layer (88);
  adhesive layer (62);
  second dielectric layer (81; 93)
  adhesive layer (62);
  third dielectric layer (88);
  conductor strip portion forming part of the second conductive spiral pattern (90, 110; 87).

96. The LC marker construction as set forth in claim 77, wherein
  said stripline portions are trapped between two flexible sheets of a cover material (65, 165) having a carrier function.

97. The LC marker construction as set forth in claim 96, wherein
  said stripline portions are fixed between said two flexible sheets of a cover material (65, 165) at least by a layer of a sealing or fixing material (61) provided and effective at least between outwardly disposed surfaces of first and second conductor strip portions (89, 90; 109; 110; 87, 87) forming said stripline portions and the respective one of said two flexible sheets.

98. The LC marker construction as set forth in claim 97, wherein
said sealing or fixing material (61) is not same as the material from which said at least one additional layer (62) is made.

99. The LC marker construction as set forth in claim 77, wherein
said LC marker construction has a square to rectangular shape and wherein
at least one layer is provided having the shape of a strip, which strip is arranged to cross conductor strip portions arranged substantially in parallel to one of both edge directions of the construction and extends, between respective two opposing edges, over the full length or width of the construction.

* * * * *